(12) United States Patent
Zirkle et al.

(10) Patent No.: US 10,454,013 B2
(45) Date of Patent: Oct. 22, 2019

(54) THERMOELECTRIC DEVICE

(71) Applicant: MicroPower Global Limited, Hamilton (BM)

(72) Inventors: Thomas E. Zirkle, Scottsdale, AZ (US); Robert M. Gardner, Gilbert, AZ (US); Robert S. Kilbourn, New Braunfels, TX (US)

(73) Assignee: MICROPOWER GLOBAL LIMITED, Tortola (VG)

( * ) Notice: Subject to any disclaimer, the term of this patent is extended or adjusted under 35 U.S.C. 154(b) by 871 days.

(21) Appl. No.: 13/678,708

(22) Filed: Nov. 16, 2012

(65) Prior Publication Data
US 2014/0137918 A1  May 22, 2014

(51) Int. Cl.
*H01L 35/32* (2006.01)
*H01L 35/34* (2006.01)
*H01L 35/08* (2006.01)

(52) U.S. Cl.
CPC ............ *H01L 35/325* (2013.01); *H01L 35/08* (2013.01); *H01L 35/34* (2013.01)

(58) Field of Classification Search
CPC .............................. H01L 35/325; H01L 35/08
See application file for complete search history.

(56) References Cited

U.S. PATENT DOCUMENTS

| 1,848,655 A | * | 3/1932 | Petrik | ...................... | H01L 35/00 |
| | | | | | 136/212 |
| 3,496,028 A | * | 2/1970 | Hampl, Jr. | .............. | H01L 35/06 |
| | | | | | 136/211 |
| 4,640,977 A | * | 2/1987 | Shakun | ................... | H01L 35/10 |
| | | | | | 136/211 |

(Continued)

FOREIGN PATENT DOCUMENTS

| CN | 102341927 A | 2/2012 |
| EP | 0176671 A1 | 4/1986 |

(Continued)

OTHER PUBLICATIONS

International Search Report for PCT/US2013/069948, dated Mar. 18, 2014, 3 pages.

*Primary Examiner* — Sadie White
(74) *Attorney, Agent, or Firm* — Abel Schillinger, LLP

(57) ABSTRACT

A thermoelectric device, module, and system, and method for and method for making is provided. The thermoelectric device (200) having a first and second elements (202 and 204). The first and second elements (202 and 204) having first and second portions (206 and 208), and third and fourth portions (212 and 214) with first and second regions (210 and 216) connected between the first and second portions (206 and 208) and third and fourth portions (112 and 114), respectively. The first and second portions (206 and 208) and third and fourth portions (112 and 114) are electrically coupled though regions (210 and 216) and with thermal conductance between first and second portions (206 and 208) and third and fourth portions (212 and 214) being inhibited by regions (110 and 116), respectively. Thermoelectric element (203) having first and second electrodes (219, 221), wherein electrode (221) of the thermoelectric element (103) is electrically and thermally coupled to portion (208) and wherein the electrode (119) is electrically and thermally coupled to portion (112).

34 Claims, 7 Drawing Sheets

(56) References Cited

U.S. PATENT DOCUMENTS

| | | | | |
|---|---|---|---|---|
| 4,650,919 A | * | 3/1987 | Benson | H01L 35/30 136/211 |
| 4,730,459 A | | 3/1988 | Schlicklin et al. | |
| 4,938,244 A | * | 7/1990 | Kumada | H01L 35/08 136/212 |
| 6,084,172 A | | 7/2000 | Kishi et al. | |
| 6,226,994 B1 | * | 5/2001 | Yamada | F25B 21/02 136/203 |
| 6,700,053 B2 | * | 3/2004 | Hara | H01L 23/38 136/203 |
| 2001/0013224 A1 | * | 8/2001 | Ohkubo | F25B 21/04 62/3.7 |
| 2002/0130407 A1 | * | 9/2002 | Dahl | C07C 4/00 257/712 |
| 2003/0064606 A1 | | 4/2003 | Hunn | |
| 2005/0241690 A1 | * | 11/2005 | Tajima | H01L 35/10 136/212 |
| 2008/0163916 A1 | * | 7/2008 | Tsuneoka | H01L 35/32 136/203 |
| 2008/0173343 A1 | * | 7/2008 | Kanno | H01L 35/18 136/201 |
| 2010/0275435 A1 | * | 11/2010 | Hiroyama | H01L 35/08 29/592.1 |
| 2012/0000500 A1 | * | 1/2012 | Iida | H01L 35/08 136/200 |
| 2012/0017963 A1 | * | 1/2012 | Stefan | H01L 35/32 136/203 |
| 2012/0211044 A1 | * | 8/2012 | Kurihara | H01L 35/32 136/220 |

FOREIGN PATENT DOCUMENTS

| | | |
|---|---|---|
| EP | 0821417 A2 | 1/1998 |
| EP | 1835551 A1 | 9/2007 |
| EP | 2405502 A1 | 1/2012 |
| JP | H10270762 A | 10/1998 |
| JP | 2003168830 A | 6/2003 |
| JP | 2010205883 A | 9/2010 |

* cited by examiner

-PRIOR ART-

THERMOELECTRIC DEVICE

FIELD OF INVENTION

The present invention generally relates to thermoelectric materials, thermoelectric devices, thermoelectric elements and the like; and more particularly, to the design of thermoelectric devices, modules, and the making of same.

BACKGROUND

A conventional thermoelectric device uses a class of materials known as thermoelectric materials that exhibit thermoelectric effects such as the Thomson effect, the Peltier effect, and the Seebeck effect to directly transduce thermal energy to electric energy flow and conversely. The thermoelectric material is formed such that there are two opposing ends, wherein the two opposing ends have thermal and electrical contacts for the generation of power using the Seebeck effect, the thermoelectric material is placed in a thermal gradient with one end being at a lower temperature and the other end being at a higher temperature. Due to the temperature difference between the two ends, the thermoelectric material generates an electrical current and voltage.

FIG. 1 is a simplified perspective illustration that is consistent with prior art wherein a portion of the top substrate has been cut away exposing the internal structure of the module 100. Heat flows vertically through module 100 whereas current flows up and down in each thermocouple which are connected in series throughout the module. Conventional thermoelectric modules use a plurality of thermoelectric devices 102, exemplified by thermoelectric couple 104 and 106, wherein both P-type thermoelectric material 110 and N-type thermoelectric material 108 are used. When conventional P-type thermoelectric material 110 and N-type thermo electric material 108 are subjected to the ame temperature gradient, N-type and P-type thermo electric materials generate electrical currents that are in opposite directions of each other. Conventional thermoelectric modules, as illustrated in FIG. 1, use this property by assembling alternating P-type and N-type materials 110 and 108 sandwiched between a common hot plate 112 and common cold plate 114 while electrically connecting them in a series circuit using a first and second plurality of metal straps of which metal straps 120 and 122 are examples. Heat flux, shown by arrows 124 and 126, pass through the P and N thermoelectric material in parallel while electrical power is generated in series wherein the voltage generated by the alternating P and N type thermoelectric materials 108 and 110 are additive.

Conventional thermo electric modules, illustrated by module 100, have several inherent problems with their design and function. Conventional designs require both N and P type devices such as thermoelectric couple 104 and 106 as previously described. The P and N thermo electric materials, for example thermoelectric materials 110 and 108, must be electrically matched often requiring different physical sizing of the individual thermoelectric materials. Since the P and N type devices are electrically coupled in series in conventional module designs, each device must generate the same individual current for optimal module performance. The thermoelectric material used in the making of the P and N type devices typically have inherently different current generation capabilities that can be alleviated by making the P and N type thermoelectric materials different sizes. The sizing of the thermo electric materials makes the module design and manufacturing more complex and expensive. Consequently, most module manufacturers find it more cost effective to make P and N devices the same size which leads to suboptimal module power generation.

The P and N devices must also be matched for thermal expansion. P and N type devices may each be made of different semiconductor material that have differing thermal expansion coefficients which causes mechanical stresses resulting in reduced module reliability and usable life times.

The temperature dependent performance of both the P and N thermoelectric materials must be matched for optimal performance. However, the peak-power operation temperature for P and N type thermoelectric materials can differ leading to suboptimal power performance when forced into a common module.

The manufacture of current module designs requires the selection and precise placement of alternating P and N type thermoelectric materials in the module array. This requires careful tracking of two types of thermoelectric materials (P and N type materials) that build the thermoelectric devices and their placement since a single misplaced thermoelectric material and/or device would impair module functionality. Different contact structures bonding the P and N type devices may also be required which makes the manufacturing process more complex and expensive.

It can be readily seen that the present design of thermoelectric devices, the design of thermoelectric modules, and the methods to make both have severe limitations and problems. Also, it is evident that the present fabrication methods for building thermoelectric devices and modules are complex and subject to reliability failures. Therefore, an article, design, and method for assembly of thermoelectric devices and modules that is cost effective, simplistic, and manufacturability in a high volume manufacturing setting is highly desirable.

SUMMARY OF THE INVENTION

We describe a method to make a thermoelectric module that remedies the aforementioned deficiencies. The present invention uses a single thermoelectric material type, either N type or P type. By the present invention all the thermoelectric devices are electrically matched for current, matched for thermal expansion, and matched for temperature operating points. By matching the current, thermal expansion, and temperature operating points, one may design and achieve optimal module performance. Also, by using a single type of thermoelectric type manufacturing complexity greatly simplified resulting in lower cost.

Briefly stated and in various representative aspects, the present invention provides an article and method for making a thermoelectric device and modules are provided. A first element having a first portion, a second portion and a region is formed. The first and second portions having first and second surfaces on the first and second portions, respectively, and wherein the first and second surfaces are electrically and thermally conductive. The first region extends from the first portion to the second portion wherein the first region is thermally insulative and electrically conductive. A second element having a third portion, a fourth portion, and a second region. The third portion and the fourth portions having sixth and seventh surfaces, respectively, and wherein the sixth and seventh surfaces are thermally and electrically conductive. The second region extends from the third portion to the fourth portion wherein the region is thermally insulative while being electrically conductive. A thermoelectric element having first and second electrodes. The first and the second electrode of the thermoelectric element are mechanically and electrically coupled to the second surface and the sixth surface of the second and third portions of the first and second elements, respectively.

In another embodiment, an article and method for making a thermoelectric module is provided. A first substrate being thermally conductive and having a first surface, a second surface, and a third surface wherein the first surface and the second surface are substantially parallel to each other and wherein the first surface and the second surface are offset and normally displaced, by a value, the third surface extends from the first and second surfaces at an angle to the first and second surfaces. The second substrate being thermally conductive and having a fourth surface, a fifth surface, sixth surface, wherein the fourth and fifth surfaces are substantially parallel and are off-set by a value, the sixth surface extends from the fourth and fifth surfaces at an angle to the first and second surfaces. A first element having a first portion, a second portion, and a region is formed. The first and second portions having seventh, eighth, ninth, and tenth surfaces on the first and second portions, respectively, and wherein the seventh and eighth surfaces are electrically and thermally conductive. The first region extends from the first portion to the second portion wherein the first region is thermally insultative while being electrically conductive. A second element having a third portion, a fourth portion, and a second region. The third portion and the fourth portions having eleventh, twelfth, thirteenth, and fourteenth surfaces, respectively, and wherein the third and fourth portions surfaces are thermally and electrically conductive. The second region extends from the third portion to the fourth portion, wherein the region is thermally insulative while being electrically conductive. A thermoelectric element disposed and electrically coupled between the first and third portions of the first and second elements and wherein the second electrically conductive element is disposed on the second thermally conductive and electrically insulative layer of the second substrate.

Additional advantages of the present invention will be set forth in the Detailed Description which follows and may be obvious from the Detailed Description or may be learned by practice of exemplary embodiments of the invention. Still other advantages of the invention may be realized by means of any of the instrumentalities, methods or combinations particularly pointed out in the claims.

BRIEF DESCRIPTION OF THE DRAWING

Representative elements, operational features, applications and/or advantages of the present invention reside inter alia in the details of construction and operation as more fully hereafter depicted, described and claimed—reference being made to the accompanying drawings forming a part hereof, wherein like numerals refer to like parts throughout. Other elements, operational features, applications and/or advantages will become apparent to skilled artisans in light of certain exemplary embodiments recited in the Detailed Description, wherein:

Figure 1:
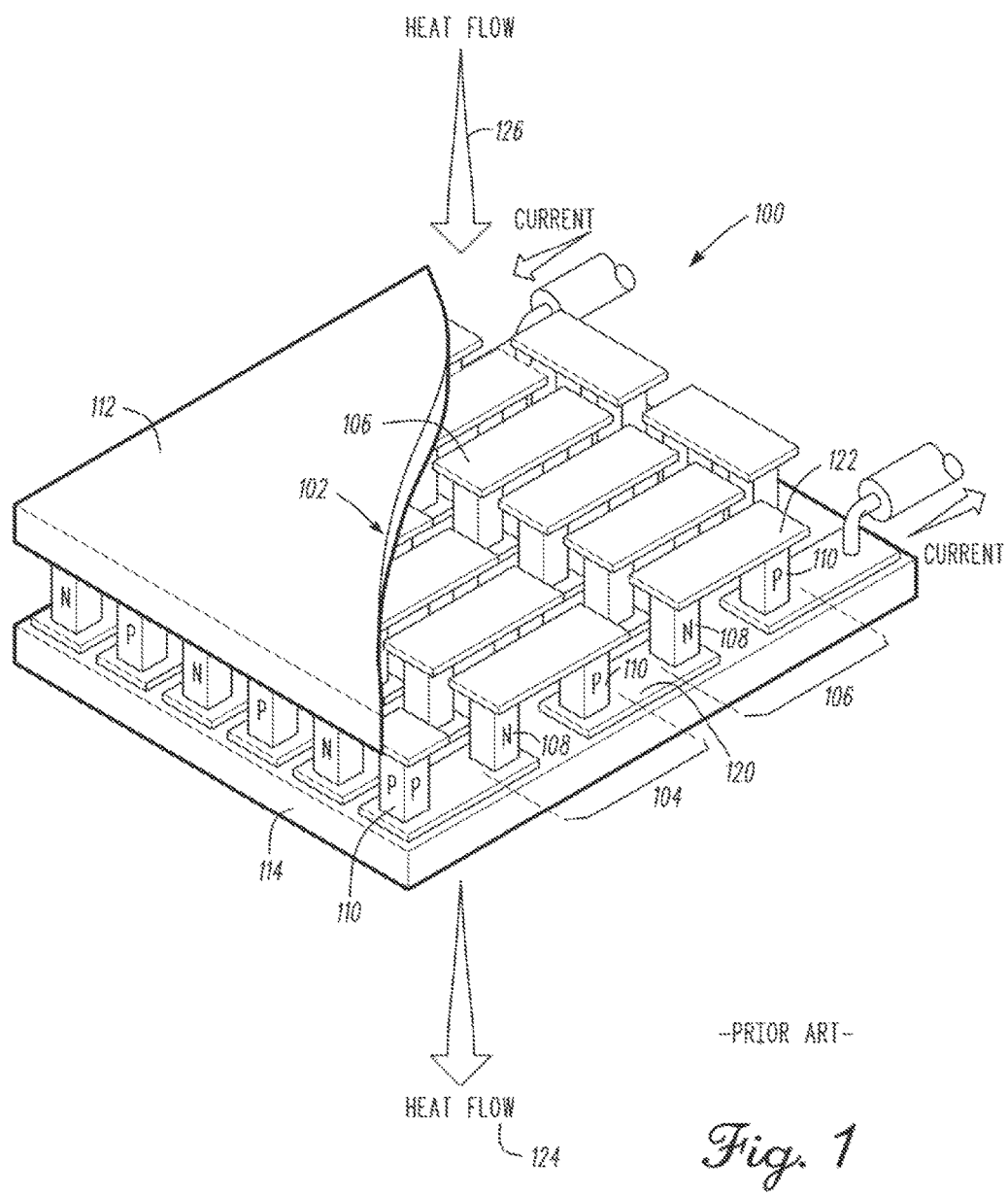
FIG. 1 is an enlarged thermoelectric module in the prior art.

Those skilled in the art will appreciate that elements in the Figures are illustrated for simplicity and clarity and have not necessarily been drawn to scale. For example, the dimensions of some of the elements in the Figures may be exaggerated relative to other elements to help improve understanding of various embodiments of the present invention. Furthermore, the terms 'first', 'second', and the like herein, if any, are used inlet alia for distinguishing between similar elements and not necessarily for describing a sequential or chronological order. Moreover, the terms front, back, top, bottom, over, under, and the like in the Description and/or in the Claims, if any, are generally employed for descriptive purposes and not necessarily for comprehensively describing exclusive relative position. Skilled artisans will therefore understand that any of the preceding terms so used may be interchanged under appropriate circumstances such that various embodiments of the invention described herein, for example, are capable of operation in other orientations than those explicitly illustrated or otherwise described.

DETAILED DESCRIPTION OF THE DRAWINGS

The following descriptions are of exemplary embodiments of the invention and the inventors' conceptions of the best mode and are not intended to limit the scope, applicability or configuration of the invention in any way. Rather, the following Description is intended to provide convenient illustrations for implementing various embodiments of the invention. As will become apparent, changes may be made in the function and/or arrangement of any of the elements described in the disclosed exemplary embodiments without departing from the spirit and scope of the invention.

A detailed description of an exemplary application, namely a system, a device, and method for making same by providing a thermoelectric device suitably adapted for use for sensing and generating power is presented as a specific enabling disclosure that may be readily generalized by skilled artisans to any application of the disclosed system and method in accordance with various embodiments of the present invention.

Before addressing details of the drawing described below, some terms are defined and/or clarified.

The term "thermoelectric device" is intended to mean any implementation of a thermoelectric material situated between at least two conductive elements electrically and mechanically coupled to the thermoelectric material.

The term "thermoelectric material" is intended to mean any material that exhibits a thermoelectric effect such as the Thomson effect, the Peltier effect and the Seebeck effect to directly transduce thermal energy to electric energy and conversely. The term "thermoelectric element" is intended to mean any aggregate of thermoelectric material that is formed such that the thermoelectric material is capable of having an electrically efficient contact. It should be understood that electrodes, tailored to the material system, can also be incorporated into the design.

The term "temperature gradient" means a temperature difference between a lower temperature and a higher temperature. Typically, thermal energy movement is described as phonons moving from an elevated temperature to a lower temperature.

The term "die" means a single thermoelectric element having any suitable three dimensional geometric configurations such as a cube, oval, cyclidar, or the like.

The term "conductive trace(s)" means a conductive material that is capable of conducting voltage and current. Typically, the conductive trace is a wire or a conductive material that has been prepared so as to be able to be capable of conducting a voltage and a current with little or no losses. By way of example only, the conductive trace(s) can be made of any conductive material such as, but not limited to, a metal, an alloy, a layered conductive structure, or the like.

The term "thermally insulative" means a material, a reconfiguration of a material, and/or a combination of materials that inhibits heat or does not allow heat to be transferred or passed though the material.

The term "electrically insulative" means a material, a reconfiguration of a material, and/or a combination of materials that inhibits current or does not allow current to be transferred or passed though the material.

The term "electrode" means an electrical connection device where current can easily flow though. The electrode can be made of any suitable material or combination of materials such as metals, combinations of metals, semiconductor materials, combinations of semiconductors, combinations of semiconductor materials and dopants, and/or a combination of any of the aforementioned materials.

The term "linear" is intended to mean having the thermoelectric devices arranged along a straight line. By way of example only, with each of the elements having a center point (a centroid) and with the center points of the elements arranged along a straight line the elements are positioned linearly. However, it should be understood that while the elements are linearly arrange, the thermoelectric devices are also vertically spaced apart to form a stair-step configuration.

The term "additive and subtractive methods" means a process wherein a first material layer or substrate is provided. A masking layer or second material layer is disposed onto either the substrate or the first material layer. Patterns or openings are subsequently opened in the masking layer or the second material layer exposing either the substrate or the first material layer. Typically, either a wet or dry chemical etch process is then done which transfers the patterns off the masking layer or the second material layer into the substrate or the first material layer.

The term "transformation of materials" is intended to mean any material that can change its original properties to either different properties and/or a combination of properties. For example, ion implantation of an oxidizing ion such as, but not limited to, oxygen into a metal such as, but not limited to tin (Sn), Copper (Cu), or the like or a semiconductor a semiconductor such as, but not limited to Silicon (Si) can transform Tin into Tin oxide ($SnO_2$), Copper oxide ($CuO_2$), Silicon dioxide ($SiO_2$), or the like.

The term "ductile metal" is intended to mean any metal that can be pulled into long, thin lengths without breaking.

The term "conventional thermoelectric couple" is defined as having a p-type thermoelectric element and a n-type thermoelectric element.

The term "unipolar thermoelectric device" is intended to mean a thermoelectric device comprising and using a single type of doped (N or P type material) thermoelectric material.

Figure 2:
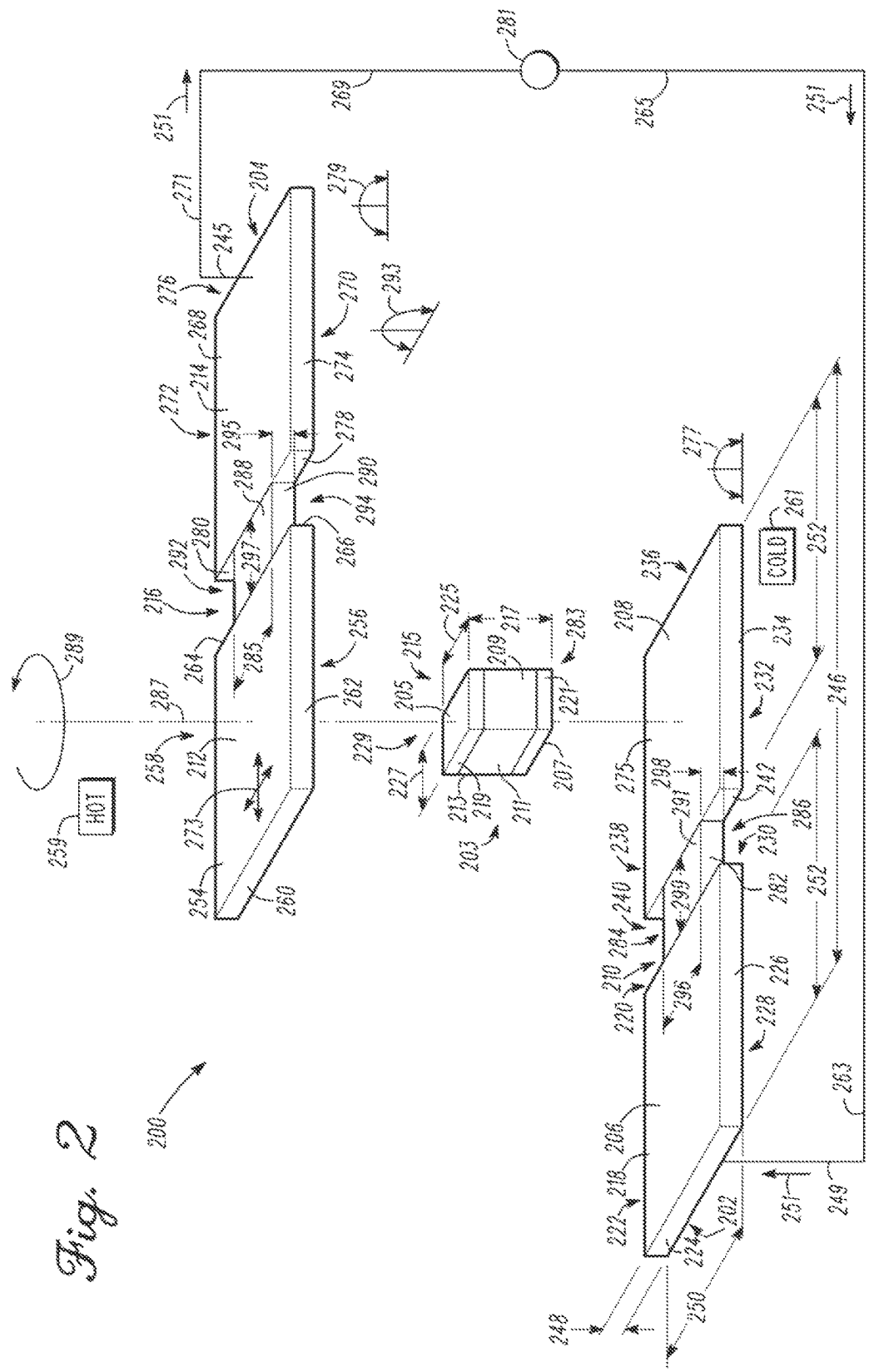
FIG. 2 is a greatly simplified exploded basic building block perspective illustration of a thermoelectric device of this invention.

FIG. 2 represents the most basic electrical and physical building block of the present invention. Heat flows vertically though the device whereas the current flows laterally, FIG. 2 is a greatly simplified exploded perspective illustration of a thermoelectric device 200 including elements 202 and 204, having portions 206 and 208, and 212 and 214, respectively, thermoelectric element 203, and regions 210 and 216. As shown in FIG. 2 portions 208, and 212, are electrically and thermally conductive and support thermoelectric element 203 and act as thermal energy collectors/spreaders for the thermoelectric element 203.

Generally, elements 202 and 204 are physically similar; however, depending upon the specific application elements 202 and 204 can vary substantially from each other as well as having variability within portions 206, 208, 212, 214 and regions 210 and 216. The region 210 and 216 are intended to electrically interconnect portions 206, 208 and 212, 214 while minimizing heat flow between said portions. Moreover, it should be understood that elements 202 and 204 have electrical characteristics and thermal characteristics, wherein portions 206, 208, 212, and 214 are both thermally conductive and electrically conductive and wherein regions 210 and 216 are both the ally insulative and electrically conductive.

Generally, as is shown in FIG. 2, portions 206, 208, 212, and 214 are shaped as a cuboid, wherein the cuboid has a length 252 and width 250 that exceeds length 227 and width 225 of the thermoelectric element 203 (1 mm to several centimeters), and a thickness 248 that conducts electricity with little resistive losses. However, it should be understood that portions 206, 208, 212, and 214 can be made to any suitable 3-D geometric structure with any suitable size such as a 3-D oval, cylinder, or the like. It should be understood that the sum of lengths 252 and length 299 is same as line 246.

Portions 206 and 208 have surfaces 218, 220, 222, 224, 226, 228, 230 and surfaces 275, 232, 234, 236, 238, 240, 242, respectively. Generally, surfaces 218 and 275 are substantially parallel and are in same plane as shown by line 246. Surfaces 228 and 232 can be substantially parallel but in different plains then surfaces 218 and 275 as line 246 shows in FIG. 2. However, in some design applications surfaces 228 and 232 can be configured in non-parallel plans. Surfaces 224, 230, 220 and 240, 242, 236 are substantially parallel with each other and surfaces 226, 222 and 238 and 234 are also substantially parallel. Surfaces 224, 230, 220 and 240, 242, 236 and surfaces 226, 222 and 238 and 234 can be formed at any suitable angle 277. It should be understood that element 204 could be manipulated like element 202. It should be understood that any angle 277 and/or angle 293 can be selected either independently or several surfaces can be linked together so that angle 277 and/or 293 is linked with several surfaces.

Portions 212 and 214 have surfaces 254, 256, 258, 260, 262, 264, 266 and surfaces 268, 270, 272, 274, 276, 278, and 280, respectively. Generally, surfaces 254 and 268 are substantially parallel and are in same plane but spaced apart.

Surfaces 256 and 270 are substantially parallel but in a different plane then surfaces 254 and 268. Surfaces 260, 264, 266 and 276, 278, and 280 are substantially parallel with each other and surfaces 262, 258 and 274 and 272 are substantially parallel to each other with surfaces 262 and 274 being in another plane and surfaces 258 and 272 being in another plane. It should be understood that surfaces 254, 256, 258, 260, 262, 264, 266 and surfaces 268, 270, 272, 274, 276, 278, 280, can be made so that the surfaces can be set at any angle 279 and/or 293. Further, the angle 279 and/or 293 of the surfaces can be set independently or several surfaces can be linked together so that angle 277 and/or 293 is linked with several surfaces.

As shown in FIG. 2, regions 210 and 216 are generally shaped as cubes; however, it should be understood that regions 210 and 216 can be shaped to any suitable desirable 3-D shape such as, but not limited to, cylinders, 3-D elipses, or the like. As shown in FIG. 2, regions 210 and 216 have widths 296 and 285, thicknesses 298 and 295, and lengths 299 and 297, respectively. Regions 210 and 216 include surfaces 291, 282, 284, 286 and surfaces 288, 290, 292, 294 are disposed between portions 206 and 208 and between portions 212 and 214, respectively, wherein surfaces 291 and 286 are parallel to each other and surfaces 284 and 282 are also parallel to each other, in such a manner that an electrical and mechanical connection is made. However, it should be understood that while good electrical conductivity is achieved between portions 206 and 208 and between portions 212 and 214, thermal conductance though regions 210 and 216 is inhibited. By way of example only and as shown in FIG. 2, regions 210 and 216 are joined to portion 206 at surfaces 230/220 and at portion 208 at surfaces 240/242; and to portion 212 at surface 266/264; and at portion 214 at surface 278/280, respectively.

Elements 202 and 204 can be made of any suitable electrically conductive material(s) such as, but not limited to, metal(s), a metal alloy(s), layered metal structures, semiconductor material(s), any combination thereof, and any materials such as, but not limited to, Copper (Cu), Aluminum (Al), Iron (Fe), Silver (Ag), Nickel (Ni), Tin (Sn), Silver (Ag), Gold (Au), Steel, Stainless Steel, Brass, Cu/Al, Bronze, Copper/Aluminum, Nickel/Copper, carbon materials, and the like can be used, as well as material alloys such as, but not limited to steel, brass, copper/aluminum, bronze, and the like can be used. Typically, the material selection for elements 202 and 204 is application specific and can vary considerably from application to application. Generally, the materials listed above can be formed or processed by any suitable method or technique and/or any suitable combination of techniques or methods such as, but not limited to, molding, stamping, milling, micro-machining, subtractive and additive processes, and the like to achieve the desired shape, dimensions, and configuration of elements 204 and 206.

Generally, portions 206, 208, 212, and 214, and regions 210 and 216 of elements 202 and 204, respectively, can be made of any suitable material or combination of materials previously described with reference to elements 202 and 204. However, it should be understood that portions 206, 208, 212, and 214 are both thermally conductive and electrically conductive and that regions 210 and 216 are thermally insulative and electrically conductive. Also, it should be understood that portions 206, 208, 212, and 214 and regions 210 and 216 are reasonably matched for coefficients of expansion so as to protect the integrity of the material and the thermoelectric devices made therefrom. In the present invention, device design, materials, and processes are used to configure portions 206, 208, 212, and 214, and regions 210 and 216 so as meet material requirements for making thermoelectric device 200.

Additionally, it should be understood that regions 210 and 216 and portions 206, 208, 212, and 214 can be made separately as discrete elements and subsequently assembled to form elements 202 and 204. Typically, assembly of portions 206, 208, 212, and 214 and regions 210 and 216 is achieved by any suitable process or technique such as, but not limited to, soldering, conductive adhesive, welding, brazing, or the like. Additionally, it should be understood that regions 210 and 216 and portions 206, 208, 212, and 214 can be formed as elements 202 and 204, wherein regions 210 and 216 and portions 206, 208, 212, and 214 can be modified by physical or chemical methods and/or processes so that portions and regions have the proper material characteristics.

So as to obtain the desired electrical and thermal characteristics of region 210 and 216 any suitable method, technique, or combination of methods or techniques can be used such as, but not limited to, the methods, techniques, or combination of methods and/or techniques described hereinabove. Typically, a mass or volume of material of regions 210 and 216 significantly removed therefrom. This can be achieved by reducing any one or all the dimensions of regions 210 and/or 216 which include lengths 299 and 297, widths 296 and 285, and thicknesses 298 and 295, respectively. By substantially removing the mass of material of regions 210 and 216 allows adequate electrical conductivity while also providing adequate thermal insulation to inhibit heat conduction between portions 206 and 208, and 212 and 214, respectively.

By way of example only, with regions 210 and 216 being made of a metal material thicknesses 298 and 295 can range from 0.05 millimeters to 5.0 millimeters; widths 296 and 288 can range from 0.5 millimeters to 5.0 millimeters, lengths 299 and 297 can range from 0.5 millimeter to 5.0 millimeters. Further, it should be understood that regions 210 and 216 do not need to share the same dimensions, i.e., lengths 299, 297, widths 296, 285, and thicknesses 298, 295 and can vary depending upon the specific application and the selection of the specific metal and/or material characteristics thereof.

With elements 202 and 204 being made of any suitable metal material or combination of materials selective oxidation of regions 210 and 216 can be performed wherein the metal of region 210 and 216 is converted to a metal oxide. Thus, enabling regions 210 and 216 to provide adequate electrical conductivity between portions 206 and 208, and 212 and 214 as well as providing adequate thermo insulation between portions 206 and 208, and 212 and 214. It should be understood by one of ordinary skill in the art that by providing a thermal insulative component to regions 210 and 216, heat, indicated by box 259, is directed and focused, though portion 212 to the cold, indicated by box 261, then though thermoelectric element 203 wherein free electrons are generated, and then the heat and the free electrons pass though portion 208. Thus, since heat is directed though thermoelectric element 203 more efficiently and with less parasitic losses, a more efficient thermoelectric element 203 overall is made with very little parasitic loss of heat is made.

The selective oxidation of regions 210 and 216 of elements 202 and 204 can be accomplished by any suitable method, technology, or combination thereof such as, but not limited to, use of oxidizing agents such as peroxides, steam, heat, pressure, ion implantation, or the like. Briefly and by way of example, portions 206 and 208 are covered with a protective covering or layer such as, but not limited to a nitride layer, an oxide layer, a photo-resist layer, or the like with regions 210 and 216 being exposed. Regions 210 and 216 are then oxidized by any suitable oxidizing method or technique such as, but not limited to exposure to elevated temperature, pressure, and an oxidative environment; on implantation, or the like which converts the exposed metal into its oxide form, while the protected metal is protected from the oxidation.

In another example, with portions 206 and 208 of element 202 being made of either a silicon material or a metal material, or the like, portions 206 and 208 are covered with a masking material such as a photo resist material, an oxide material, or the like. Thus, portions 206 and 208 are protected by the masking material while region 210 of element 202 is left exposed. The protected portions 206 and 208 and the unprotected region 210 is then subjected to ion implantation by oxygen ions. Typically, these oxygen ions are implanted at energies ranging, but not limited to 10 keV to 5 MeV with a nominal energy ranging between 100 keV to 4 MeV. Once region 210 has been implanted with oxygen ions, element 202 is cleaned in any suitable manner so as to remove the protective masking material. Typically, this is done with wet chemistry, dry chemistry, or a combination of both wet and dry chemistry. Typically, element 202 is then annealed in any suitable atmosphere such as but not limited to, nitrogen, forming gas, and in some cases exposure to steam and pressure can be used. It should be understood that exposure to different gases and/or chemicals, temperatures, and time can change the chemical make-up of region 210, thereby change the electrical conductivity and thermal conductivity of region 210 to a desired level.

In the case of elements 202 and 204 being made of a carbon material and/or any one of the carbon material derivatives any suitable process or methods can be used such as, but not limited to, stable carbon oxides, carbon fiber, graphite and the like. It should be understood that each different carbon material can have widely differing processes that can be used. For example, carbon fiber can be molded to be shaped into elements 202 and 204. Additionally, the electrical and thermal conductivity can be altered by impregnating the carbon fibers with metal particles or metal ions, laminating, molding, layering with ceramic materials, or the like Generally, dimensions of portions 206, 208, 212, and 214 are similar; however, it should be understood that specific dimensions are application specific. Thus, dimensions of one portion, e.g., portion 206 can be very different from any of the other portions e.g., portion 208 or the dimension e.g., portion 206 and portion 208 can be the same. Typically, thickness 248 must be sized to comfortably conduct electricity and thermal energy with little resistive losses; a width 250 and length 252 of portions 206 and 208 is sized such that it comfortably exceeds the length 227 and width 225 respectively of the thermoelectric element 203, with thermoelectric element being any suitable dimension from 1.0 mm square to several centimeters square.

As stated previously, regions 210 and 216 can be made of any suitable material, combination materials, transformation of materials, or sizing of materials such that the material or materials are substantially electrically conductive and the thermal conductance is minimized. As shown in FIG. 2, region 210 is disposed or made between portions 206 and 208. Additionally, a surface 256 of element 204 is disposed over a surface 275 of element 202 and wherein thermoelectric element 203 is disposed between surface 275 and surface 256 such that surfaces 275 and 256 of elements 202 and 204, respectively, are thermally and electrically coupled to surfaces 205 and 207, respectively. Generally, regions 210 and 216 have similar geometric shapes and dimensions; however, it should be understood that any suitable geometric shape can be used either singly or in combination. (See FIG. 3) Additionally, it should be further understood that while the dimensions of region 210 will be discussed, the discussion is equally applicable to the region 216. By way of example only, as shown in FIG. 2, regions 210 and 216 are depicted as a rectilinear block. However, regions 210 and 216 could be shaped as an oval with portions 206, 208 and portions 212 and 214 being therebetween. Additionally, regions 210 and 216 could be formed such that regions 210 and 216 could extend across the entire width 250 of surfaces 220, 230, 240 and 242, and surfaces 264, 266, 278, 280, respectively.

Region 210 can be made of any suitable thermally insulative and electrically conductive solid foams of Aluminum, Carbon, Copper, Inconel, Nickel, Silicon Carbide, Silicon Nitride, Tin, Zinc, and others. One such example is Duocel Copper Foam (ERG Aerospace Corporation) having a thermal conductance of 10 watts/meter-degree Kelvin and an electrical resistance of $6.5 \times 10^{-5}$ ohms-meters. Another example is Carbon CFOAM (Touchstone Research Laboratory) having a thermal conductance of 0.25 watts/meter-degree Kelvin and an electrical resistance of $1 \times 10^{-2}$ ohms-meters. Another example is carbon nanofoam (MarkeTech International) having a thermal conductance of 0.09 watts/meter-degree Kelvin and an electrical resistance of $3 \times 10^{-2}$ ohms-meters.

Additionally, thermally insulative polymer based materials with electrically conductive additives can be used such examples are thermally insulative Dyneon conductive nylon, polyester urethane, or polyether urethane (3M Company) which utilize various electrically conductive additives to reduce electrical resistance to 1e3 ohms-meters. Another example is Metal Rubber (NanoSonic Inc) composed of engineered polymers incorporating electrically conductive metal nanoclusters that results in a thermally insulative material with electrical conductivity on the same order of magnitude as that of metals such as copper, silver and aluminum. Another example is an electrically-conductive thermal insulator (Lockheed Martin Corporation, US2003/0064606) that combines a polymer silicone with open-cell metallic foam.

Also, metal conductors such as Nickel, Aluminum, Copper, Silver, Gold, Tin, Zinc, Lead, Tellurium, Cobalt, Molybdenum, Titanium, Indium, Platinum, Palladium, and Antimony that are shaped to reduce the cross sectional area to greatly lower the thermal conductivity to the target value while still retaining electrical conductivity.

Interstitial carbon graphites tuned with thermally insulative additives and lattice orientation resulting in thermal conductance ranging of 6 to 24 watts/meter-degree Kelvin and an electrical resistances of 1 to $6 \times 10^{-5}$ ohms-meters. Also, thermally insulative and electrically conductive ceramics and layered ceramics and the like can be used.

Further and by way of example only, region 210 can be made of Indium Tin Oxide ($InSnO_2$) that is joined or disposed between portions 206 and 208 of element 202 and portions 212 and 214 of element 204 by any suitable method, technique, or means. By way of example only, region 210 is disposed by adhering region 210 between portions 206 and 208 by a conductive adhesive, a conductive paste, welding, brazing or solder such as, but not limited to, a silver paste or the like. Typically, element 202 is then annealed in any suitable atmosphere such as but not limited to, nitrogen, forming gas, and in some cases exposure to steam and pressure can be used. It should be understood that exposure to different gases and/or chemicals, temperatures, and time can change the chemical make-up of region 210, thereby change the electrical conductivity and thermal conductivity of region 210 to a desired level.

In yet another example, region 210 can be made of a blend of high temperature polymers such as, but not limited to silicones, polyetheretherkones (PEEK), polyphenylene sulfide (PPS), polyethermides, polyamidimides, polyimides, sulfones, and the like. The high temperature polymers can then be blended with conductive particles and/or nanoparticles so as to yield the appropriate thermal insulative and the appropriate electrical conductivity.

As shown in FIG. 2, thermoelectric element 203 is formed as a cube having surfaces 205, 207, 209, 211, 213, and 215 wherein surface 205 forms a top surface 205 and surface 207 forms a bottom surface 207, with surfaces 209, 211, 213, 215 forming the side surfaces of the cube. Electrodes 219 and 221 are disposed and/or fabricated on ends 283 and 229, respectively, of thermoelectric element 203. Generally, electrodes 219 and 221 are made so that there is a good electrical, mechanical, and thermal connection from the thermoelectric element 203 to portions 208 and 212 of elements 202 and 204, thus enabling the current and voltage generated by the thermoelectric element 203 to flow though elements 202 and 204 as shown in FIG. 2, while regions 210 and 216 restricts the flow of thermal energy between portions 206 and 208, and between portions 212 and 214, thereby directing, focusing, and maximizing the thermal energy though thermoelectric element 203 so that the current and voltage generated by thermoelectric element 203 is maximized while minimizing parasitic thermal energy loses.

Thermoelectric element 203 can be made of any suitable thermoelectric material such as, but not limited to, bismuth chalcogenides, lead telluride (PbTe), Bismuth Telluriede (BiTe), inorganic clathrates, silicides, silicon germanium and or silicon-germanium alloys, magnesium group IV compounds, skutterudite thermoelectrics, oxide thermoelectric materials, half Heusler alloys, and the like.

Electrodes 219 and 221 of thermoelectric element 203 are made by any suitable method or technology or combination of methods or technologies. Generally, electrodes 219 and 221 are made so that the current-voltage (I-V) curve of the region is linear and symmetric, thereby allowing the flow of electrons to pass easily through thermoelectric device 200. Depending upon the specific application, electrodes 219 and 221 can be made by a combination of several technologies such as, but not limited to, doping, annealing, implanting, deposition, wet chemistry, plating techniques including electrolytic and electro-less and the like. It should be understood that some of the methods and technologies' can be practiced at a wafer scale. However, it should be further understood that some of these processes are sometimes repeated at an individual die level scale.

Typically, electrodes 219 and 221 are made by cleaning the appropriate faces of thermoelectric element 203 of all oxides, contaminates, and the like by any suitable method or technology, including any wet or dry method or technology. Electrodes 219 and 221 may be doped with either a p-type or n-type dopant. After doping and cleaning are complete, other material layers can be disposed on electrodes 219 and 221 such as, but not limited to, metals, conductive materials, nanostructure, solders, and the like. The contact areas and/or electrodes are then ready for bonding to elements 202 and 204.

Thermoelectric element 203 is disposed onto and thermally and electrically coupled to surfaces 256 and 275 by any suitable method or process such as, but not limited to, soldering, electrical adhesive, ultrasonic fusion, compression or alloying layers by annealing, or the like. Generally, electrodes 219 and 221 need to be in good electrical, thermal, and mechanical, connection with surfaces 275 and 256 of portions 208 and 212, respectively, for optimal performance.

Functionally, as shown in FIG. 2, thermoelectric device 200 is made by having electrode 219 of thermoelectric element 203 disposed on portion 212 of element 204 and having electrode 221 of thermoelectric element 203 disposed on portion 208 of element 202, wherein electrodes 219 and 221 are thermally, electrically, and mechanically coupled to portions 212 and 208, respectively. Subsequently, thermoelectric device 200 is placed in a temperature gradient wherein portion 212 is in contact with the hot side, indicated by box 259, of the temperature gradient and wherein portion 208 is in contact with the cold side, indicated by box 261. By having thermoelectric device 200 between the hot side 259 and the cold side 261, a voltage and a current are generated from the thermoelectric element 203. The voltage and current are connected from portions 212 to 214 through region 216 and likewise from portions 208 to 206 though region 210. The current and voltage are then capable of being output directly from portions 214 and 206 via lines 245, 271, 269, 265, 263, and 249 and measured in meter 281. Because regions 210 and 216 are both electrically conductive and thermally insulative, adequate amount of electrons are harvested from thermoelectric element 203, while the thermal energy is focused into and though thermoelectric element 203 leaving little thermal energy to waste. In general, it is desirable to have the thinnest and largest surface area that can be supported by the available heat from heat source, illustrated by the word Hot inside box 259 in FIG. 2 and cooling from the cooling source, illustrated by the word Cold inside box 261 in FIG. 2.

Additionally, as shown in FIG. 2, the physical relationship between elements 202 and 204 and thermoelectric element 203 can vary depending upon the specific application. For example, using a center line 287 which could run though a center of portion 208, a center of thermoelectric element 203, and a center of portion 212, thereby being able to geometrically center portions 208 and 212 and thermoelectric element 203 on top of each other.

In another example and as shown in FIG. 2, portions 208 and 212 can be off-set, indicated by arrow 273. Off-set 273 can be adjusted to any suitable dimension as long as thermoelectric element 203 is thermally and electrically coupled to portions 208 and 212.

In yet another example, with element 202 positioned as shown in FIG. 2, element 204 can be positioned anywhere along a three hundred sixty degree arc, indicated by arrow 289. Thus, by allowing and/or choosing to position elements 202 and 204, thermoelectric device 200 is rotationally flexible in design which allows for easier design for use and positioning of elements 202 and 204. This flexibility further increases the compactness and decreases the size of thermoelectric device 200.

As is also illustrated in FIG. 2, when there is a temperature difference between portions 208 and 212 of element 202 and 204, respectively meter 281 measures a certain voltage. Generally, for an N-type device, arrow 251 indicates the direction of the current flow.

Figure 3:
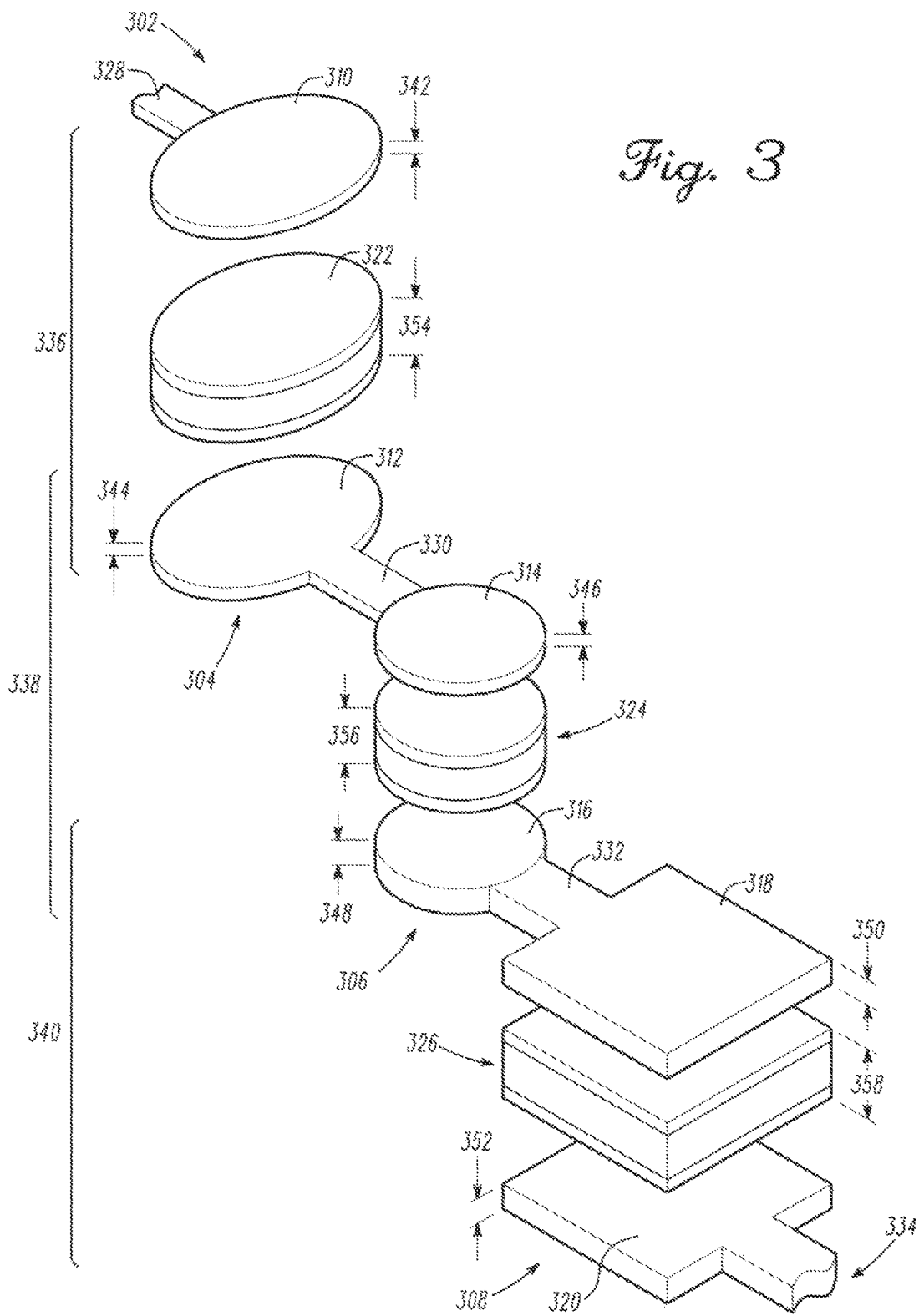
FIG. 3 is a greatly simplified exploded illustration of different configurations of element, portions, and thermoelectric materials having different geometric designs.

FIG. 3 illustrates various alternatives of the basic configurations discussed in FIG. 2. Referring now to FIG. 3, portions 310, 312, 314, 316, 318, 320 of elements 302, 304, 306, and 308, respectively, can be made having any suitable three dimensional geometric designs, with portions 310 and 312 having thicknesses 342 and 344, respectively, illustrating oval shapes, portions 314 and 316 having thicknesses 346 and 348, respectively, illustrating cylindrical shapes, and portions 318 and 320 having thicknesses 350 and 352, respectively, illustrating rectangular shapes. Also, as shown in FIG. 3, thermoelectric elements 322, 324, and 326 having thicknesses 354, 356, and 358, respectively, can also be made or shaped to any suitable three dimensional shape with thermoelectric element 322 illustrating oval shapes, thermoelectric element 324 illustrating circular or disc shapes, and thermoelectric element 326 illustrating rectangular shapes.

Regions 328, 330, 332, and 334 can also be shaped to any suitable three dimensional geometric configuration such as, but not limited to, circular, rectangular, or the like As shown in FIG. 3 and by way of example, thermoelectric elements 322, 324, 326 can be made to approximate and/or fill the specific geometric surface areas of portions 310, 312, 314, 316, 318, and 320, respectively, of elements 302, 304, 306, and 308, respectively. While any suitable thickness 354, 356, and 358, for example, can be used to generate a working thermoelectric device, illustrated by thermoelectric devices 336, 338, and 340, performance is influenced by thickness and surface area. Selecting the optimum values for these parameters is determined by the system application.

Figure 4:
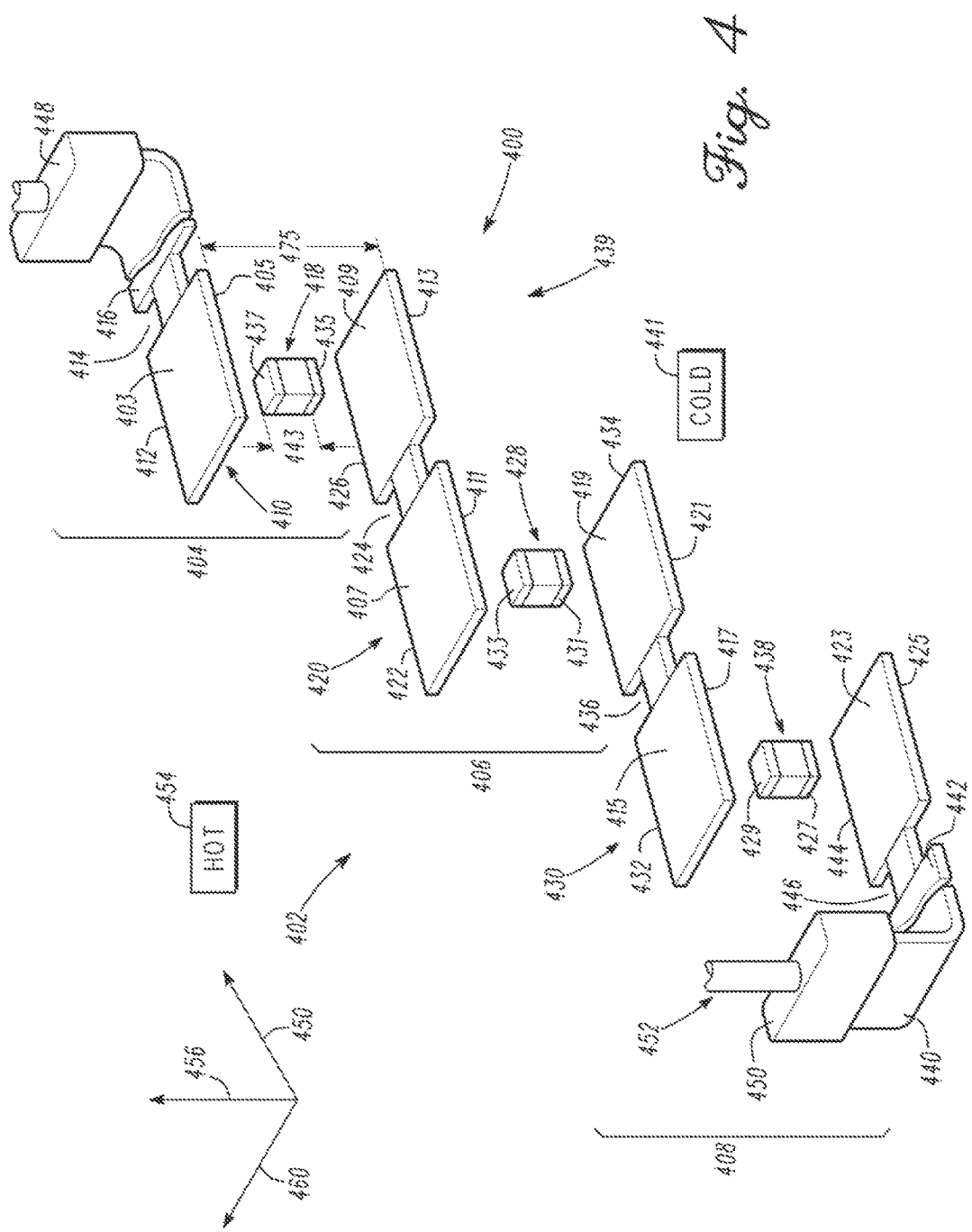
FIG. 4 is a greatly simplified exploded illustration of the electrical componets of a plurality thermoelectric devices connected in series so as to form a linear thermoelectric module.

FIG. 4 is an exploded view of the electrical and physical configuration of a multi-leg module including external electrical interconnects. The stair-step feature is shown wherein the thermal energy flows vertically though the structure and the current flows laterally though the structure. FIG. 4 is a greatly simplified exploded illustration of a thermoelectric module 400 having a plurality of thermoelectric devices 402 positioned linearly. As shown in FIG. 4, the plurality of thermoelectric devices 402 includes thermoelectric devices 404, 406, and 408. Thermoelectric device 404 further includes elements 410 and 420 with portions 412 and 416, and portions 422 and 426, respectively, wherein portion 416 is configured so as to receive an electrical receptacle 448 and wherein portion 412 includes surfaces 403 and 405 and wherein portions 422 and 426 include surfaces 407 and 411 and surfaces 409 and 413, respectively. Regions 414 and 424 are disposed between portions 412 and 416, and 422 and 426, respectively, with thermoelectric element 418 having electrodes 435 and 437, wherein electrodes 435 and 437 are electrically, thermally, and mechanically coupled to portions 426 and 412, respectively.

Thermoelectric device 406 further includes elements 420 and 430 with portions 422 and 426 and portions 432 and 434 having surfaces 415 and 417, and surfaces 419 and 421, respectively. Regions 424 and 436 are disposed between portions 422 and 426, and 432 and 434, respectively, with thermoelectric element 428 having electrodes 431 and 433, wherein electrodes 431 and 433 are electrically, thermally, and mechanically coupled to portions 434 and 422, respectively.

Thermoelectric device 408 further includes elements 430 and 440 with portions 432 and 434, and portions 442 and 444 having surfaces 423 and 425, wherein portion 442 is configured so as to receive an electrical receptacle 450, regions 436 and 446 are disposed between portions 432 and 434, and 442 and 444, with thermoelectric element 438 having electrodes 427 and 429, wherein electrodes 427 and 429 are electrically, thermally, and mechanically coupled to portions 444 and 432, respectively.

Generally, the plurality of thermoelectric devices 402 of thermoelectric module 400 are configured as having a stair-step configuration 439, wherein elements 410, 420, 430, and 440 and their associated thermoelectric elements 418, 428, and 438, are disposed and coupled in a unique vertical, horizontal, and longitudinal manner. As shown in FIG. 4, with a vertical axis represented by line 456, a horizontal axis represented by line 450, and a longitude axis represented by line 460, it can be seen that surface 405 of portion 412 is disposed on electrode 437 of thermoelectric element 418 and surface 409 of portion 426 is disposed on electrode 435 of thermoelectric element 418. Additionally, surface 411 of portion 422 is disposed on electrode 433 of thermoelectric element 428 and surface 419 of portion 434 is disposed on electrode 431 of thermoelectric element 428. Also, surface 417 of portion 432 is disposed on electrode 429 of thermoelectric element 438 and by having surface 423 of portion 444 is disposed on electrode 427 of thermoelectric element 438. It can be readily seen that as additional thermoelectric elements are added, a stair-step design 439 is formed. It should be understood that any suitable number of thermoelectric devices can be added to the plurality of thermoelectric devices 402. By adding additional thermoelectric electric devices to the plurality of devices 402 a corresponding amount of voltage and current is generated. Using thermoelectric devices 404 and 406 as examples, it can be seen that thermoelectric elements 418 and 428 can be moved anywhere on their respective surfaces 405, 409, 411, and 419 in both longitudinal, indicated by arrow 460, and horizontal directions, indicated by arrow 450. It can also be seen that thickness 475 between surface 405 and surface 409 is dependant on thickness 443 of thermoelectric element 418.

As shown in FIG. 4, thermoelectric devices 404, 406, and 408 have a hot side, indicated by box 454, and a cold side, indicated by box 441, thereby developing a temperature gradient across thermoelectric elements 418, 428, and 438, respectively. With the temperature gradient across the thermoelectric elements 418, 428, and 438 a corresponding voltage and current is developed from each thermoelectric device 404, 406, and 408. Since the thermoelectric devices 404, 406, and 408 are electrically connected in series, each voltage from each thermoelectric device is summed. By way of example only, if thermoelectric device 404 outputs 0.5 volt, thermoelectric device 406 outputs 0.7 volt, and thermoelectric device 408 outputs 0.8 volt, the total voltage output from thermoelectric module 400 is 2.0 volts. Thus it should be understood that a desired amount of voltage is capable of being adjusted for by either subtraction or addition of thermoelectric devices that are connected in series.

Typically, the total amount of current from thermoelectric module 400 is dependant on the material characteristics of the thermoelectric elements 418, 428, and 438, the temperature gradient across thermoelectric elements 418, 428, and 438; however, in accordance with normal electrical principals, current is not additive, i.e., the current from thermoelectric devices 404 and 406 do not sum even if thermoelectric devices 404 and 406 are connected in series, the current is the same no matter where it is measured. However, it should be understood by one of ordinary skill in the art, that there are things that can change current such as, but not limited to, a total amount of surface area of the thermoelectric elements 418, 428, and 438 that is in contact with portions 412, 426, 422, 434, 432, and 444 of elements 404, 406, and 408. Alternatively, multiple thermoelectric elements may be mounted next to each other to effectively increase the surface area.

While thermoelectric module 400 is shown to include thermoelectric devices 404, 406, and 408, it should be understood that this is merely an example and that thermoelectric module 400 can include any suitable number of thermoelectric devices. It should be understood that materials and processes that have been discussed previously with regards to FIGS. 2 and 3, apply to FIG. 4. Additionally, for the sake of clarity, it should be understood that each thermoelectric device shares an element with the devices next to it in the stair step chain, as shown in FIGS. 4, 5, 6, 7, and 8. By way of example only, thermoelectric device 406 shares element 420 between thermoelectric device 404 and 406. This is done so that a complete functioning thermoelectric device is formed and illustrated which is electrically connected in series.

As shown in FIG. 4, portions 416 and 442 are formed so as to be capable of receiving electrical receptacles or plugs 448 and 450. Electrical plugs or receptacles 448 and 450 are fitted with an electrically conductive means 452 such as, but not limited to, electrically conductive wire, electrically conductive traces or the like so that the electrical energy generated by thermoelectric module 400 can be transported to another location.

Figure 5:
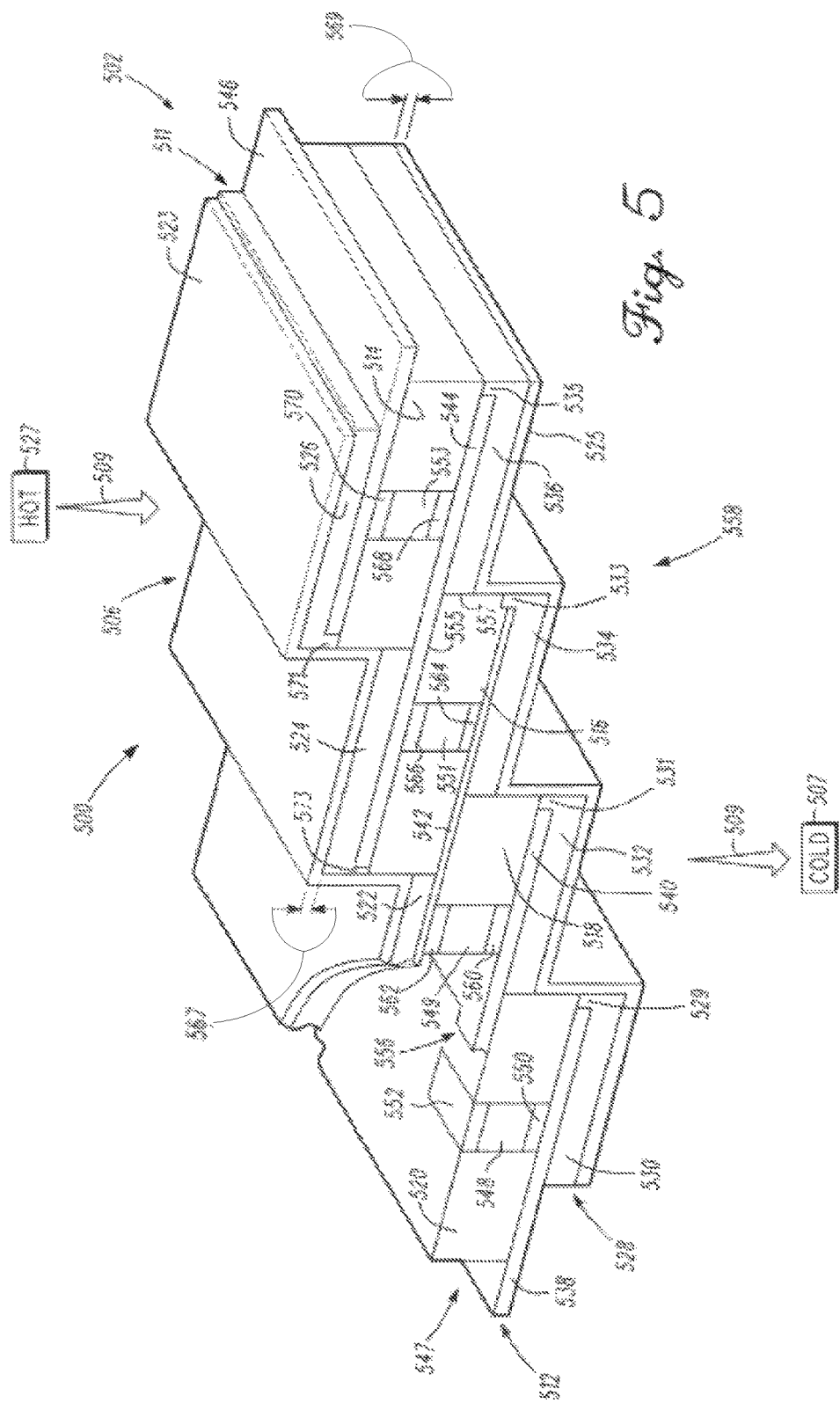
FIG. 5 is a greatly simplified perspective sectional illustration of thermoelectric module having a plurality of thermoelectric devices connected in series having insulative members, with certain portions removed to reveal the inner workings in greater detail.

FIG. 5 is a perspective center line sectional view of a fully configured module including all insulating and enclosure materials. Where heat flows vertically though the structure and current passes laterally though the stair-step structure. Referring now to FIG. 5, FIG. 5 is a greatly simplified perspective sectional illustration of thermoelectric module 500 having certain portions removed so as to reveal the inner workings of thermoelectric module 500. The plurality of thermoelectric devices 502 further include elements 538, 540, 542, 544, and 546, a plurality of thermoelectric elements 547, identified individually as thermoelectric elements 548, 549, 551, and 553 and having electrodes 550 and 552, 560 and 562, 564 and 566, and 568 and 570, respectively. It should be understood that each of the elements 538, 540, 542, 544, and 546 include two portions and a region therebetween these features are not shown but, should be assumed to be present, for purposes of clarity of the illustration. Elements 538, 540, 542, 544, and 546 and thermoelectric elements 548, 549, 551, and 553 have been described and characterized hereinabove as elements 202 and 204 thermoelectric element 203 and need not be extensively characterized here. Region 556 has been previously described as regions 210 and 216 of FIG. 2, regions 328, 330 and 332 of FIG. 3, regions 446, 436, 424, and 414 of FIG. 4.

It should be understood that a portion (not shown) of element 540 that would normally extend from region 556 and a portion of the thermally conductive and electrically insulative region 518 (not shown) that would cover portions of element 540 and portion of thermally insulative and electrically insulative region 520 have been removed so as to more clearly illustrate the present invention.

The plurality of thermoelectric devices 502 further includes a plurality of thermally insulative and electrically insulative regions 512 which are individually identified as thermally insulative and electrically insulative regions 514, 516, 518 (a portion not shown), and 520, a plurality of thermally conductive and electrically insulative regions 511 which are individually identified as thermally conductive and electrically insulative regions with the first region in this series is not shown for purposes of clarity, 522, 524, and 526, and a plurality of thermally conductive and electrically insulative regions 528 individually identified as thermally conductive and electrically insulative regions 530, 532, 534, and 536.

It should be understood that the plurality of thermally insulative and electrically insulative regions 512 can be filled with any suitable ally insulative and electrically insulative material or combination of materials such as a gas, an areogel, an areogel derivative, or the like. The pluralities of thermally conductive and electrically insulative regions 511 and 528 can be filled with any suitable material that is thermally conductive and electrically insulative and/or combination of materials such as ceramics (e.g., Boronitride (BN) and alumina nitride), anodized layers (e.g. anodized Al), and the like. By focusing and/or concentrating heat from the hot side, indicated by box 527, to be focused and/or concentrated into and though thermoelectric elements 548, 549, 551, and 553, indicated by arrows 509 traveling to cold side, indicated by box 507, allows for a more efficient heat gathering and processing and subsequently a greater generation of electrical power. Any suitable method or technique can be used to fill the plurality of thermally insulative and electrically insulative regions 512 and the pluralities of thermally conductive and electrically insulative regions 511 and 528 such as pick and place, additive and subtractive techniques including lithography, deposition, and the like.

As shown in FIG. 5, layers 523 and 525 are disposed on the exterior surface of the plurality of thermoelectric devices 502 so as to a self-contained module 500. Layers 523 and 525 can be made of any suitable material that conducts heat such as, but not limited to, a metal, e.g. Aluminum (Al), Copper (Cu), Tin (Sn), Nickel (Ni), Titanium (Ti), Ruthium (Ru), Manganese (Mn), or the like, any suitable alloy such as Steel (generalized formula $Fe_3C$), Stainless Steel, bronze, Brass ($Cu_3Zn_2$), Copper Aluminum (CuAl), Silicon (Si), diamond like material, or the like, or any combination thereof, or the like. Additionally, it should be understood that materials can also be intermixed wherein layer 523 is made of a copper material and layer 525 is made of an aluminum material. It should be understood that many other material selections can be made and that selection materials is dependant on the specific material characteristics and on the specific application. Further, it should also be understood that thickness 567 and 569 of layers 523 and 525, respectively, can be made to any suitable thickness. By way of example, thickness 567 and 569 of layers 523 and 525 can range from 1.0 micron to 10.0 centimeters or larger. It should be understood that the larger thicknesses of layers 523 and 525 can be made as separate metal pieces that conform to the contours of stair-step configuration 558 that would allow layer 523 and 525 to be made separately and that can subsequently be pressed together to form layers 523 and 525 that holds and contains the pluralities of thermally conductive and electrically insulative regions 511 and 528, the plurality of thermally insulative and electrically insulative regions 512, the plurality of thermoelectric elements 547, and elements 538, 540, 542, 544, and 546 together.

Making of layers 523 and 525 can be accomplished by any suitable method or technique, such as deposition, e.g., sputtering, sintering, or the like, forming, e.g., milling, molding, stamping, and/or physical application of preformed layers 523 and 525, and the like.

Generally, as is shown in FIG. 5, elements 538, 540, 542, 544, and 546 are positioned such that thermoelectric elements 548, 549, 551, and 553 are disposed on elements 538, 540, 542, 544, and 546 to make a stair-step 558 configuration as shown in FIG. 5, wherein the thermoelectric elements 548, 549, 551, and 553 are electrically connected in series by elements 538, 540, 542, 544, and 546. The pluralities of thermally conductive and electrically insulative regions 511 and 528 layers are disposed on and around elements 538, 540, 542, 544, and 546 and with thermally insulative and electrically insulative regions 512 surrounding the plurality thermoelectric elements 547 the heat conduction is efficiently moved to the plurality of thermoelectric elements 547. With the plurality of thermally conductive and electrically insulative regions 511 disposed on the top surface of elements 538, 540, 542, 544 and 546 and on portions of the plurality of thermally insulative and electrically insulative regions 512, and with the plurality of thermally conductive and electrically insulative regions 528 disposed on the bottom surface of elements 538, 540, 542, 544 and 546 and on portions of the plurality of thermally insulative and electrically insulative regions 512, portions 529, 531, 533, and 535; and 571 and 573 of the plurality of thermally conductive and electrically insulative regions 511 are disposed on the ends of elements 538, 540, 542, 544 and 546 and further insulating the elements by sealing up to the plurality of insulative layers 512.

Using thermoelectric device 502 as an example, it can be seen that electrode 564 of thermoelectric element 551 is disposed of element 542. Additionally, electrode 566 of thermoelectric element 551 is positioned and would be disposed such that electrode 566 would be coupled to element 544. While in FIG. 5 thermoelectric element 551 is in the form of a cuboid, it should be understood that any geometric configuration could be used. Additionally, as can be seen in FIG. 5 that thermal insulative and electrically insulative layer 516 is adjacent and surrounds thermoelectric element 551. By making the thermally insulative and electrically insulative region 516 as close as and/or bonded together with thermoelectric element 551, allows the thermal energy from the thermal gradient to be directed into and though the thermoelectric element 551 and limit any degradation of thermoelectric element 551. By increasing and tightly controlling the flow of thermal energy though the thermoelectric element 551, the efficiency of the thermal electric device 506 and thermoelectric module 500 as a whole greatly improves.

Electrical output of thermoelectric module 500 is accomplished by electrically connecting to exposed portions of elements 546 and 538.

Figure 6:
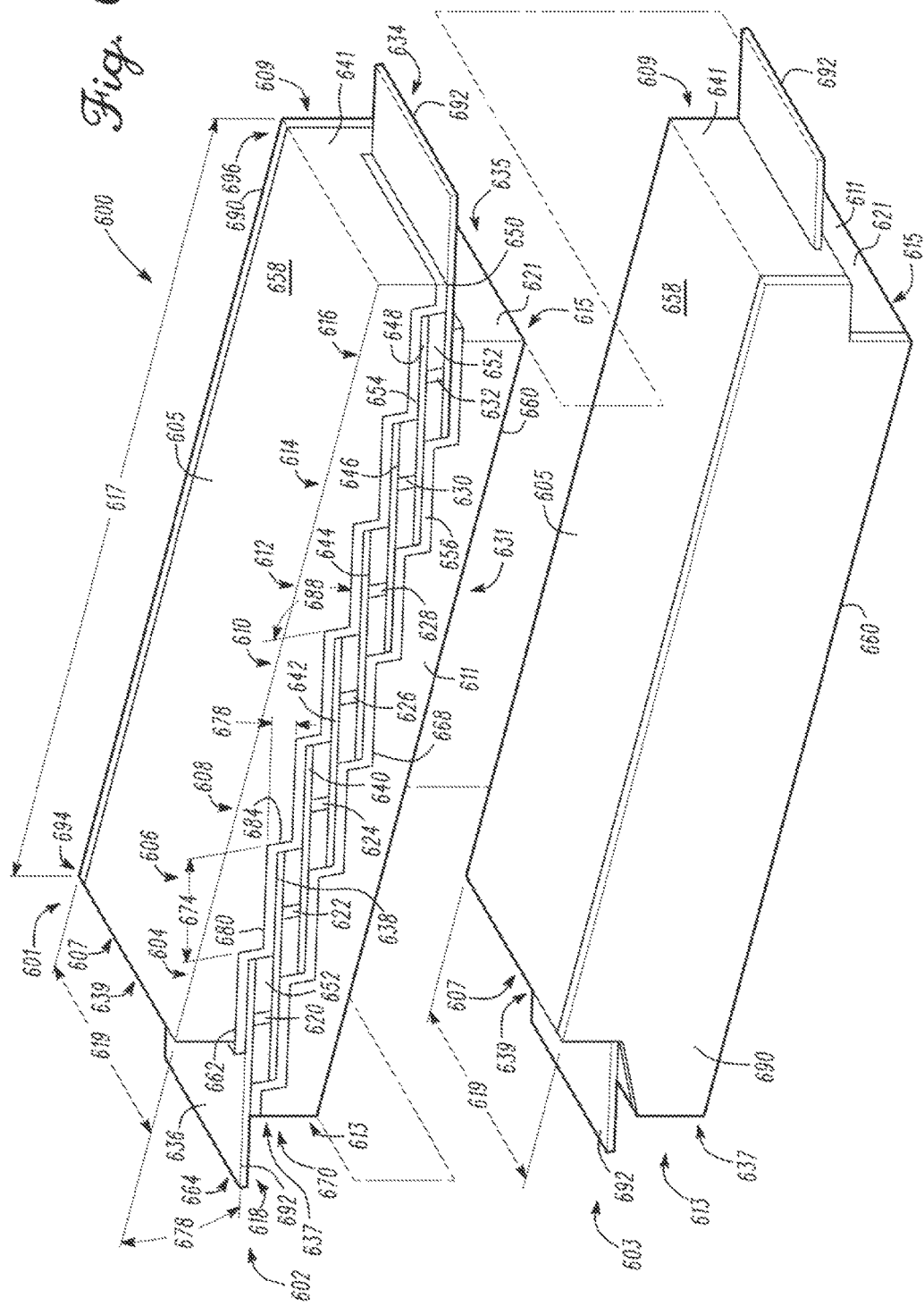
FIG. 6 is a greatly simplified perspective sectional illustration of a thermoelectric module wherein a portion is moved away so as to illustrated as a simplified perspective internal sectional view of thermoelectric module and wherein a portion is a simplified perspective view of thermoelectric module illustrating the exterior surfaces of thermoelectric module.

FIG. 6 is a perspective center line sectional view illustrating portions 601 and 603, wherein portion 601 illustrates, among other things, the inside and the outside of the module and wherein portion 603 illustrates, among other things, the outside configuration of portion 603. Heat flows vertically though the structure and current passes laterally though the stair-step 664 and 670 structure. FIG. 6 is a greatly simplified perspective sectional illustration of a thermoelectric module 600 that has been sectioned laterally from ends 607 and 613 to ends 609 and 615 separated and moved apart to form portions 601 and 603. Portions 601 and 603 have been moved apart so that inner workings 631 can be seen of thermoelectric module 600. It should be understood that the inner workings 631 of thermoelectric module 600 are very similar to the inner working of thermoelectric module 500 and as such the inner workings 631 of thermoelectric module 600 will retain the same identifying names and will not be discussed in any great detail except in pertinent parts.

Generally, thermoelectric module 600 can be any suitable dimension, wherein length 617 can range from 10.0 mm to 500.0 mm, with nominal range being 30.0 mm to 250.0 mm, and with a preferred range being from 46.2 mm to 106.2 mm. Additionally, thermoelectric module 600 can be any suitable width 619, wherein width 619 can range from 3.0 mm to 300.0 mm, with a nominal range from 10.00 mm to 200.0 mm, and with a preferred range from 11.0 mm to 30.0 mm. It should be understood that thermoelectric module 600 is shown can be shaped differently then that as shown in FIG. 6 depending upon the specific design requirements.

As shown in FIG. 6, portions 601 and 603 include substrates 605 and 611, wherein substrate 605 includes surfaces 658, 641, 639, and internal surface 662 and wherein substrate 611 includes surfaces 621, 637, 660 and internal surface 668. Generally, surfaces 658, 641, 637, 621, 660 and 639 are exterior surfaces of portions 601 and 603 and can be made to any suitable shape or form. As can be seen, internal surfaces 662 and 668 are made in a stair-step configuration 664 and 670, respectively, so as to build the plurality of thermoelectric devices 602. It should be understood that when portions 601 and 603 are mated together surfaces 658, 641, 637, 621, 639, and 660 of portions 601 and 603 will come together and will form their respective continuous surfaces.

Substrates 605 and 611 can be made of any suitable material that is thermally conductive such as, but not limited to, metals, metal alloys, composite metals, layered metals, semiconductors, or the like. Typical metals that can be used, but are not limited to, are Copper (Cu), Aluminum (Al), Tungsten (Ti), Iron (Fe), Nickel (Ni), Stainless Steel, and the like. Typical metal alloys that can be used, but are not limited to, are steel, bronze, and the like. Typical metal composites that can be used, but are not limited to, are Cooper/Aluminum, Nickel/Iron, and the like. Typical layer metals that can be used, but are not limited to are Copper/Gold, Aluminum/Gold, Nickel/Copper, or the like. It should be understood that material selection and process selection is application specific and that not all materials are capable of being processed with the same process. It should be understood that if substrates 605 and 611 were thermally conductive and electrically insulative, the thermally conductive and electrically insulative layers 654 and 656 could be eliminated. Further, it should be understood that any suitable process or method can be used to make substrates 605 and 611 such as, but not limited to, molding, milling, etching, or the like.

As shown in FIG. 6, internal surfaces 662 and 668 are made into stair-step configurations 664 and 670, respectively. Stair-step 664 and 670 configuration of internal surfaces 662 and 668 can be made by any suitable method or technique such as but not limited to, molding, milling, or the like. Using thermoelectric devices 606 and 608 as an example, the stair-steps 664 and 670 are made in internal surface 662 of a portion 601 having a length 674 and having a height 678. As can be seen, in portion 601, stair-steps 664 and 670 are positioned at an angle 679 with reference to surface 658. Angle 679 can be set to the suitable angle depending on the dimensions of selected internal components. Typically, angle 679 can range from 5.0 degrees to 45.0 degrees or the like. By setting angle 679 to a greater angle, more space is afforded so that a greater number of thermoelectric devices can be placed into a module unit area. Moreover, with a larger number of thermoelectric devices being able to be positioned and with surfaces 658 and 660 having the ability to be flat and/or arbitrarily formed such that surfaces 658 and 660 can mate with a thermal energy source or sink, the efficiency of turning heat to electricity of module 600 increases, thereby increasing the generated power of thermoelectric module 600 as a whole. As shown in FIG. 6, surfaces 680 and 684 are shown to be at an angle 688 which is shown as a ninety (90) degrees angle. However, it should be understood that the angle 688 can vary to any suitable angle desired. Typically, angle 688 can range between 60 degrees and 120 degrees, with 90 degrees being preferred.

By forming internal surfaces 662 and 668 into stair-steps 664 and 670 configurations and positioning internal surfaces 662 and 668 opposed to each other and with a lateral shift, a plurality of thermoelectric devices 602, a plurality of thermoelectric elements 618, a plurality of elements 634, a thermally conductive and electrically insulative layers 654 and 656, and a plurality of thermally insulative and electrically insulative regions 635 can be formed and/or positioned therebetween to make the plurality of thermoelectric devices 602. Further, it should be understood that by having internal surfaces 662 and internal surface 668 laid-open facilitates the build up of the plurality of thermoelectric devices 602.

The plurality of thermoelectric devices 602 indicated individually as 604, 606, 608, 610, 612, 614, and 616 positioned in a stair-step configuration 664 and 670, wherein a plurality of thermoelectric elements 618 individually identified as thermoelectric elements 620, 622, 624, 626, 628, 630, and 632 are connected in electrical series via a plurality of elements 634 individually indentified as elements 636, 638, 640, 642, 644, 646, 648, and 650, with a plurality of thermally insulative and electrically insulative regions 635 disposed around the plurality of thermoelectric elements 618, exemplified by thermally insulative and electrically insulative regions 652 disposed around thermoelectric elements 620 and 632.

Thermally conductive and electrically insulative layers 654 and 656 are disposed on internal surfaces 662 and 668 of substrates 605 and 611, respectively. The thermally conductive and electrically insulative layers 654 and 656 provide an electrical barrier between substrates 605 and 611 of module 600 and the plurality of elements 634, the plurality of thermoelectric elements 618, and the thermally insulative and electrically insulative regions 635. However, it should be understood that thermally conductive and electrically insulative layers 654 and 656 allows thermal energy to pass though the thermoelectric module 600 while electrically isolating inner workings 631 from substrates 605 and 611. By allowing thermal energy to pass though the plurality of thermoelectric elements 618, a portion of the thermal energy is converted to electrical energy that is conducted out of thermoelectric module 600 through contacts 692.

Portions 601 and 603 illustrates one embodiment of the exterior configuration of thermoelectric module 600, surfaces 658 and 660 provide surfaces for heat conduction into and through the plurality of thermoelectric devices 602, and out of thermoelectric module 600. In this particular embodiment surfaces 658 and 660 are illustrated as flat and smooth. However, it should be understood by one of ordinary skill in the art that surfaces 658 and 660 can be made to any desirable shape such as, but not limited to, concave, convex, and/or conform to any desired shape, or the like.

It should be further understood that thermally conductive and electrically insulative layers 654 and 656 can be made of any suitable material such as, but not limited to, pastes, epoxies, polymer sheets, ceramics (BN, AlN), anodized Al, or the like. It should be further understood that the materials and techniques used for working portions as described in FIG. 5 can be adopted and used in the techniques and methods for make thermoelectric module 600 as shown in FIG. 6. Moreover, it should be understood that in order to facilitate the fabrication of the plurality of thermoelectric devices 602 stair-steps 664 and 670 are formed into surfaces internal 662 and 668 of substrates 605 and 611, respectively, so that stair-steps 664 and 670 are open and exposed. With stair-steps 664 and 670 being opened and exposed, one of the substrates, e.g., substrate 605, the plurality of thermoelectric elements 618, the plurality of elements 634, the thermally conductive and electrically insulative layers 654 and 656, and the plurality of thermally insulative and electrically insulative regions 635 are correctly formed and/or positioned on substrate 605 by any suitable means such as, but not limited to, manually or automated, e.g., pick-and-place systems, or the like, thus the stair-steps 664 and 670 act as a basis for assembly of thermoelectric module 600. Once the plurality of thermoelectric devices have been correctly assembled on substrate 605, substrate 611 is then secured on substrate 605 so as to hold inner workings 631 to complete the thermoelectric module 600.

Side caps 690 are shown and disposed on portions 601 and 603, side caps are made of any suitable material that is electrically insulative and are heat resistant in consideration as to the environment that thermoelectric module 600 is going to be placed into. Materials such as, but not limited to, plastics, ceramics, fibers, pastes, putties, epoxies or the like can be used. It is also contemplated in this invention that edges of end caps 690 could be recessed so as to only expose surfaces 658 and 660.

Electrical connectors 692 are positioned at ends 694 and 696 so as to be connected to a load (not shown). Electrical connector 692 can be of any suitable configuration so that power generated by the plurality of thermoelectric devices 602 can be used.

By way of example only, thermoelectric module 600 starts with two stainless steel substrates 605 and 611 that have a flat outer surfaces 658 and 660, an angled stair steps 664 and 670 structures respectively, which are milled into internal surfaces 662 and 668 as illustrated FIG. 6. As shown in FIG. 6, a total of seven steps are shown in stair-steps 664 and 670 having a capacity to hold seven thermoelectric elements 620, 622, 624, 626, 628, 630, and 632. Thermoelectric module 600 has a total length 617 of about 76.2 mm and a width of about 12.7 mm, Each step has a length 674 of about 2.5 mm and a height of about 12.7 mm. Surface 656 and internal 662 is layered with electrical insulative layer 654 and 656 made of a hot pressed ceramic boron nitride that has a thickness of about 1.59 mm.

The plurality of elements 634 can be cut from copper, nickel, or the like flat stock, wherein the shape and dimensionality conforms to the design requirements. Typically, the thickness the flat stock is approximately 0.5 mm to 2.0 mm; however, it should be understood that any suitable thickness could be used.

The plurality of thermoelectric elements 618 are then placed and positioned between the plurality of elements 634 as shown in FIG. 6. The plurality of thermoelectric elements 618 as illustrated are made of Doped N-Type PbTe. The pluralities of thermoelectric elements 618 have dimensions of about 2.0 mm by 2.0 mm with a height of about 1.86 mm. The plurality of thermoelectric elements 618 are then coupled to portions of elements with solder having a composition of lead-tin-silver flux core solder used to couple the plurality of thermoelectric elements to the portions. Substrate 605 and 611 are then placed on each other a shown in FIG. 6 and clamped together as shown in FIG. 6. Electrical connection leads 692 at ends 694 and 696 extend outward to allow the power generated to be use or measured in any suitable manner.

There is a range of dimensions and materials of the different components that will operate in this module design. By way of example only, current step dimensions of length 674 and width being 7 mm by 7 mm, respectively, with a height 678 of about 2.23 mm and that was repeated 6 times. The electrical interconnects 636 and 692 are fabricated from nickel plate having a thickness of 0.50 mm. These interconnects can also be made using any suitable electrical conductor such as nickel plated copper. The material that can make up the plurality of thermally insulating and electrically insulating regions 635 was chosen to be boron nitride because of the low thermal resistivity and high electrical resistivity. However, materials such as, but not limited to, thermal epoxies and ceramic coatings can be used. Substrate 605 and 611 can be optimized to have the proper step dimensions and number of steps to match the power specifications of the application desired. Substrates 605 and 611 can be made of any suitable material such as, but not limited to, Copper (Cu), Brass ($Cu_3Zn_2$), steel (FeC), Titanium. (Ti), or the like. The thermoelectric element can have larger dimensions and 3 mm by 3 mm die have been used, die with larger surface areas will increase the current that is produced.

Figure 7:
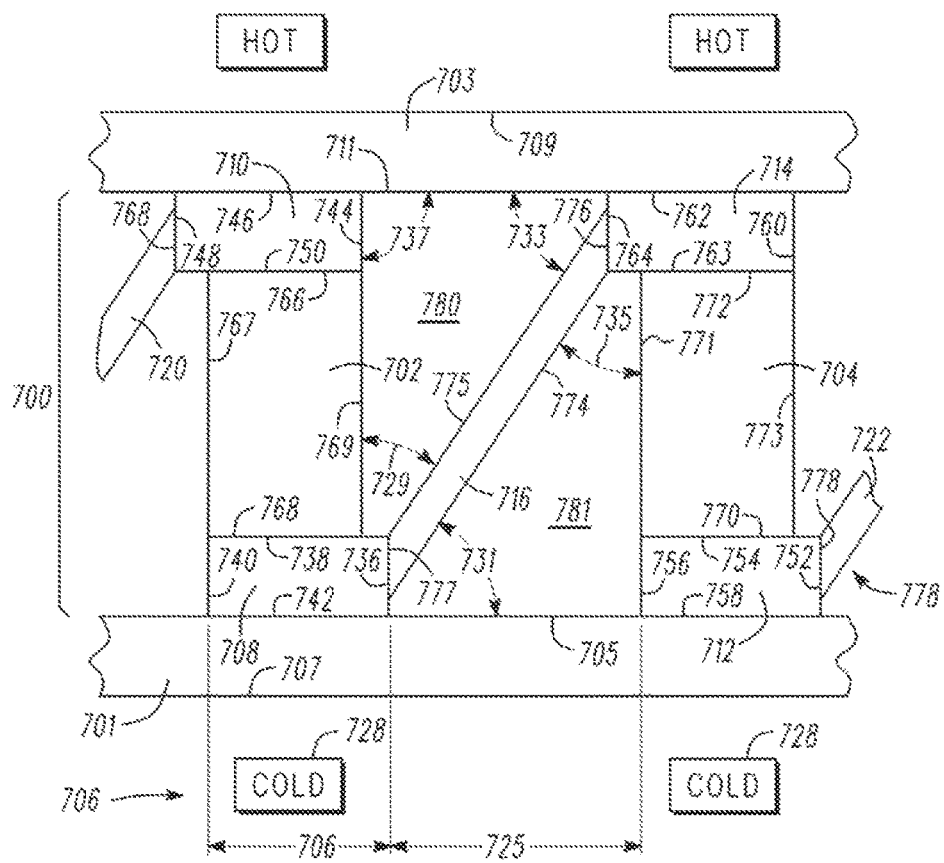
FIG. 7 is a greatly simplified sectional illustration of alternative embodiment of thermoelectric devices of this invention.

FIG. 7 is a schematic sectional illustration showing an alternative design of a thermoelectric device 700, wherein the thermal energy flows vertically though the device and the current flows up and down though the device. FIG. 7 is a greatly enlarged simplified sectional illustration of thermoelectric device 700. It should be understood that since FIG. 7 is a sectional view of thermoelectric device 700, where thermoelectric device 700 can extend into and out of FIG. 7 as well as extending from side to side, illustrated by regions 720 and 722 that are broken off, of FIG. 7, thereby illustrating the capability of using a plurality of thermoelectric devices (not shown) to make a module or modules using tens, hundreds, thousands or more thermoelectric devices. Thus, it should be understood that FIG. 7 is an example of an embodiment of the present invention and that it is meant to be illustrative of single thermoelectric device 700 and that many other thermoelectric devices for modules can be designed within the scope of the invention.

Generally, any suitable materials, combination of materials, transformation of materials, methods and/or techniques for making can be used to make thermoelectric device 700 some of which have been previously discussed hereinbefore. It should be understood that materials discussed previously is incorporated herein and can be used throughout this application. Moreover, so as to bring clarity to the present patent application, certain materials, techniques, and process need not be discussed at length again except in pertinent parts. With the teachings provided in the present patent application, one of ordinary skill in the art would be able to use the teachings provided to make and use the present invention.

Referring now to FIG. 7, thermoelectric device 700 includes substrates 701 and 703 with surfaces 705, 707 and 709, 711, respectively, thermoelectric elements 702 and 704 having surfaces 766, 768 and 770, 772, on which electrodes could be disposed that are not show in FIG. 7 for the sake of clarity of presentation. with portions 708, 710 and 712, 714 having surfaces 736, 738, 740, and 742, surfaces 744, 746, 748, and 750; surfaces 752, 754, 756 and 758; and surfaces 760, 762, 764, and 763, respectively, and regions 716, 720, and 722 having surfaces 774, 775, 776 and 777; surface 768, and surface 778; respectively.

Generally, with reference to FIG. 7, substrates 703 and 711 are made of any suitable thermally conductive and electrically insulative material such as, but not limited to, ceramic materials, high temperature polymers, and the like. It should be understood that conductive substrates can not be used to make thermoelectric device 700 as drawn in FIG. 7. However, with an addition of an insulative layer between surfaces 711 and 705 of substrates 703 and 701, respectively, and surfaces 746 and 762 of portions 710 and 714, respectively, and surfaces 742 and 758 of portions 708 and 712, respectively, use of conductive substrates can be used. Additionally, it should be understood that surfaces 711 and 705 of substrates 703 and 701, respectively, are reasonably flat so as to facilitate the physical and thermal connection between surfaces 746 and 762 of portions 710 and 714 and surfaces 742 and 758 of portions 708 and 712.

Generally, portions 708, 710, 712, and 714 are shaped as a cuboid; however, it should be understood that other 3-D geometric shapes or patterns can be used as well as described with reference to FIGS. 2-6. Portions 708, 710, 712, and 714 are made having a length 706, a width (not shown), and a height 715; however, it should be understood that portions 708, 710, 712, and 714 can be made to any suitable dimension. It should be further understood that dimensionality can vary considerably depending upon design considerations and applications. Typically, length 706 can range from 1.0 millimeters to 10.0 centimeters, with a nominal range between 2.0 millimeters to 2.0 centimeters, and with a preferred range between 2.0 millimeters to 1.0 centimeters. Width can be approximated and conforms to FIGS. 2-6. Height 715 can range from 0.001 millimeters to 1.0 centimeters, with a nominal range between 0.1 millimeters to 2.0 millimeters, and with a preferred range between 0.2 millimeters to 0.5 millimeters. It should be further understood that dimensions of portions 708, 710, 712, and 714 can vary between the portions 708, 710, 712, and 714.

Portions 708, 712, 710 and 714 are made such that surfaces 736, 738, 740, and 742, surfaces 752, 754, 756, and 758, surfaces 744, 746, 748, and 750, and surfaces 760, 762, 764, and 763 form 3-D rectangles, respectively, wherein surfaces 742, 758, 750, and 766 form bases, and wherein surfaces 740, 736, and surfaces 756, 752, wherein 748, 744, wherein surfaces 764, 760 form sides of the 3-D rectangle that are positioned at ninety (90) degree angles to surfaces 742, 750, and 766 758, respectively, with surfaces 738, 754, 746, and 762 being located on their respective sides so as to complete the 3-D rectangles.

Also, thermoelectric elements 702 and 704 are made as cuboid or a 3-D rectangles. Thermoelectric elements 702 and 704 are made having surfaces 766, 768, 767, and 769 and surfaces 770, 771, 772, 773 wherein surface 768 and 770 act as bases, wherein surfaces 767, 769, and surfaces 771, 773, respectively, act as sides, and wherein surfaces 766 and 772 acts as top surfaces, respectively, for thermoelectric elements 702 and 704.

Generally, region 716 can be made of any thermally insulative and electrically conductive material or combination of materials with any suitable method or technique. These materials and techniques have been discussed hereinabove and do not need to be discussed in depth except in pertinent part.

As shown in FIG. 7, regions 716, 720, and 722 are shaped as a cuboid. Region 716 is physically and electrically coupled to portions 708 and 714, wherein surface 777 is connected to surface 736 and wherein surface 776 is connected to 764. Regions 720 and 722 are also physically and electrically connect to portions 710 and 712. However, since regions 720 and 722 are cut off physical and electrical connection to there other portions in the series respective electrodes are not shown.

Generally, region 716 is defined by surfaces 774, 775, 776, and 777 wherein surface 775 of region 716 extends from portion 708 to surface 764 of portion 714, wherein surface 774 of region 716 extends from portion 714 to surface 736 of electrode 708, wherein surface 777 of region 716 is adjacent to surface 736 of portion 708, and wherein surface 776 of region 716 is adjacent to surface 764 of portion 714. However, it should be understood that depending upon the design, processing, and configuration of thermoelectric device 700, region 716 can have several variations provided that an electrical connection is made between portion 708 and 714. For instance, region 716 is connected to the vertical edges of portion 708 and 714, whereas region 716 may also connect to a horizontal surface extension of portions 708 and 714. Additionally, it should be understood that region 716 can also be in contact with either or both substrates 703 and 701.

Generally, portions 708 and 712 are physically connected to surface 705 on substrate 701 with length 725 being between surface 736 and surface 756. Thermoelectric elements 702 and 704 are electrically and physically connected to portions 708 and 712, respectively, wherein surfaces 768 and 770 are coupled to surfaces 738 and 754, respectively. Additionally, portions 710 and 714 are electrically and physically connected to thermoelectric elements 702 and 704, respectively, wherein surfaces 750 and 763 are coupled to surfaces 766 and 772, respectively. Additionally, portions 710 and 714 are physically coupled to surface 711 of substrate 703.

As shown in FIG. 7, surfaces 736 and 756 of portions 708 and 712, respectively, are set apart by distance 725. Additionally, surfaces 744 and 764 of portions 710 and 714, respectively, are also set apart by distance 725. However, it should be understood that disposal or placement of portions 708, 710, 712, and 714 can be independent depending upon design considerations. That is, distance 725 can be different for each portion pairs. For example, with distance 725 being 25 millimeters between surface 744 and surface 764 of portions 710 and 714, respectively. Distance 725 could be 35 millimeters between surfaces 736 and 756 of portions 708 and 712, respectively. In another example, having portions 710 and 708 and thermoelectric element 702 can be fixed together as a stack and portions 712 and 714 and thermoelectric element 704 can also be fixed together and keeping the same dimensionality as another stack. When distance 725 between surfaces 736 and 756 of portions 708 and 712, respectively, increases, distance 725 increases, as well as having angles 729, 733, 731, and 735 changes in accordance with increasing or decreasing distance 725. The paired angles 733 and 731 along with angles 729 and 735 are generally coupled and can range from greater then ninety (90) degrees to less then 30 degrees and from zero (0) to greater then sixty (60) degrees, respectively.

Generally, thermoelectric elements 702, and 704 have been described hereinbefore, with reference to FIGS. 2-6 and do not need to be described at length here. Dimensions, materials, and process are similar and one of ordinary skill would be able to modify said dimensions, materials, and processes to suit specific design requirements. However, it should be understood that these changes contemplated and are part of the present invention.

As shown in FIG. 7, thermally insulative and electrically insulative regions 780 and 781 are generated by region 716 traversing between portions 708 and 714. The materials and their characteristics have been discussed hereinabove with reference to the plurality of thermally insulative and electrically insulative regions 512 of FIG. 5 and do not need to be describe again.

In the foregoing specification, the invention has been described with reference to specific exemplary embodiments; however, it will be appreciated that various modifications and changes may be made without departing from the scope of the present invention as set forth in the claims below. The specification and figures are to be regarded in an illustrative manner, rather than a restrictive one and all such modifications are intended to be included within the scope of the present invention. Accordingly, the scope of the invention should be determined by the claims appended hereto and their legal equivalents rather than by merely the examples described above. For example, the steps recited in any method or process claims may be executed in any order and are not limited to the specific order presented in the claims. Additionally, the components and/or elements recited in any apparatus claims may be assembled or otherwise operationally configured in a variety of permutations to produce substantially the same result as the present invention and are accordingly not limited to the specific configuration recited in the dams.

Benefits, other advantages and solutions to problems have been described above with regard to particular embodiments; however, any benefit, advantage, solution to problems or any element that may cause any particular benefit, advantage or solution to occur or to become more pronounced are not to be construed as critical, required or essential features or components of any or all the claims.

As used herein, the terms "comprises", "comprising", or any variation thereof, are intended to reference a non-exclusive inclusion, such that a process, method, article, composition or apparatus that comprises a list of elements does not include only those elements recited, but may also include other elements not expressly listed or inherent to such process, method, article, composition or apparatus. Other combinations and/or modifications of the above-described structures, arrangements, applications, proportions, elements, materials or components used in the practice of the present invention, in addition to those not specifically recited, may be varied or otherwise particularly adapted by those skilled in the art to specific environments, manufacturing specifications, design parameters or other operating requirements without departing from the general principles of the same.

We claim:

1. A thermoelectric device including a hot side and a cold side opposite the hot side, the thermoelectric device comprising:
  a first element having a first portion, a second portion and a first region, the first and second portions of the first element being electrically conductive, the first region being electrically conductive and thermally insulative disposed between the first and second portions of the first element;
  a second element having a third portion, a fourth portion, and a second region, the third and the fourth portions of the second element being electrically conductive, the second region being electrically conductive and thermally insulative disposed between the third and fourth portions of the second element; and
  a plurality of thermoelectric elements including a first thermoelectric element and a second thermoelectric element,
  wherein:
    the first thermoelectric element is disposed on the second portion of the first element, and the first thermoelectric element is disposed on the third portion of the second element, the hot side of the thermoelectric device is closer to the second portion of the first element than to the first thermoelectric element, the cold side of the thermoelectric device is closer to the third portion of the second element than to the first thermoelectric element, the cold side of the thermoelectric device is closer to the fourth portion of the second element than the first thermoelectric element, the second thermoelectric element is disposed on the fourth portion of the second element and spaced apart from the first thermoelectric element, and wherein all of the thermoelectric elements within the thermoelectric device have a same conductivity type.

2. The thermoelectric device as claimed in claim 1 wherein the first and second elements are made of a metal.

3. The thermoelectric device as claimed in claim 2 wherein the metal is copper or nickel.

4. The thermoelectric device as claimed in claim 1 wherein the first and second elements are made of a metal alloy.

5. The thermoelectric device as claimed in claim 4 wherein the metal alloy is made in part of aluminum.

6. The thermoelectric device as claimed in claim 1 wherein the first region is made in part of a nickel material.

7. The thermoelectric device as claimed in claim 1 wherein the first thermoelectric element is made of lead telluride (PbTe).

8. The thermoelectric device as claimed in claim 1 wherein the first thermoelectric element is made of a bismuth chalcogenide.

9. The thermoelectric device as claimed in claim 8 wherein the bismuth chalcogenide is Bismuth Telluride.

10. The thermoelectric device as claimed in claim 1 wherein the first thermoelectric element is made of silicon-germanium.

11. The thermoelectric device as claimed in claim 1 wherein the first portion, the second portion, the third portion, and the fourth portion are linear.

12. The thermoelectric device as claimed in claim 1 wherein the second and third portions are substantially parallel.

13. The thermoelectric device as claimed in claim 1 wherein the first portion and the fourth portion are at ninety degree angles.

14. A thermoelectric device comprising:
a first element having a first portion, a second portion, and a first region, the first portion having a first surface and a second surface opposite the first surface, the second portion having a third surface and a fourth surface opposite the third surface, wherein the first portion and the second portion are electrically and thermally conductive, the first region extends from the first portion to the second portion and is thermally insulative and electrically conductive;

a second element having a third portion and a fourth portion, and a second region, the third portion having a fifth surface and a sixth surface opposite the fifth surface, the fourth portion having a seventh surface and a eighth surface opposite the seventh surface, wherein the third portion and the fourth portion are electrically and thermally conductive, and the second region extends from the third portion to the fourth portion and is thermally insulative and electrically conductive, wherein the first, third, fifth, and seventh surfaces face one side of the thermoelectric device, and the second, fourth, sixth, and eighth surfaces face another side of the thermoelectric device;

a first thermoelectric element having a first contact area and a second contact area, the first contact area of the first thermoelectric element electrically and mechanically coupled to the fourth surface of the second portion of the first element and the second contact area of the first thermoelectric element electrically and mechanically coupled to the fifth surface of the third portion of the second element; and a second thermoelectric element having a third contact area and a fourth contact area, the third contact area of the second thermoelectric element electrically and mechanically coupled to the fourth portion of the second element, wherein:
the first and second thermoelectric elements have a same conductivity type, and
the third portion, the fourth portion, and the second region of the second element are substantially parallel.

15. The thermoelectric device as claimed in claim 14 wherein the first region is made of a copper material.

16. The thermoelectric device as claimed in claim 14 wherein the first, third, fifth, and seventh surfaces face a hot side of the thermoelectric device, and the second, fourth, sixth, and eighth surfaces face a cold side of the thermoelectric device.

17. The thermoelectric device as claimed in claim 14 wherein the first region is made of an oxide.

18. The thermoelectric device as claimed in claim 17 wherein the oxide is made of Iridium Tin Oxide ($InSnO_2$) or Tin Oxide ($SnO_2$).

19. The thermoelectric device as claimed in claim 14, wherein:
the first surface of the first portion of the first element and the third surface of the second portion of the first element are in a first plane,
the second surface of the first portion of the first element and the fourth surface of the second portion of the first element are in a second plane,
the fifth surface of the third portion of the second element and the seventh surface of the fourth portion of the second element are in a third plane, or
the sixth surface of the third portion of the second element and the eighth surface of the fourth portion of the second element are in a fourth plane.

20. The thermoelectric device as claimed in claim 14 further comprising:
a third element having a ninth surface and a tenth surface opposite the ninth surface, wherein the ninth surface faces the one side of the thermoelectric device, and the tenth surface faces the other side of the thermoelectric device, wherein the
second thermoelectric element is disposed on the eighth surface of the fourth portion of the second element and disposed on the ninth surface of the third element.

21. The thermoelectric device as claimed in claim 20 wherein no thermoelectric element is in direct physical contact with any of:
the second surface of the first portion of the first element;
the third surface of the second portion of the first element;
the sixth surface of the third portion of the second element; and
the seventh surface of the fourth portion of the second element.

22. The thermoelectric device as claimed in claim 14, wherein the first portion, the second portion, and the first region of the first element are substantially parallel.

23. The thermoelectric device as claimed in claim 14, wherein the first surface of the first element is made of a metal.

24. The thermoelectric device as claimed in claim 23, wherein the metal of the first surface comprises of at least one of Cu, Al, AlCu, Ag, Steel, Fe, a monocrystalline material, a polycrystalline material, and an amorphous material.

25. A thermoelectric device comprising:
- a first substrate having an internal surface in a stair-step configuration including a first plurality of stair-steps, being thermally conductive and having a first surface, a second surface, and a third surface, wherein the first and second surfaces are substantially parallel and are off-set by a value, the third surface extends between the first and second surfaces at a first angle to the first and second surfaces,
- a second substrate having an internal surface in a stair-step configuration including a second plurality of stair-steps, being thermally conductive and having a fourth surface, a fifth surface, and a sixth surface, wherein the fourth and fifth surfaces are substantially parallel and are off-set by a value, the sixth surface extends between the fourth and fifth surfaces at a second angle to the fourth and fifth surfaces;
- a first thermally conductive and electrically insulative layer disposed on the first, second, and third surfaces of the first substrate;
- a second thermally conductive and electrically insulative layer disposed on the fourth, fifth and sixth surfaces of the second substrate;
- a first electrically conductive element having a first portion with seventh and eighth surfaces and a second portion having ninth and tenth surfaces, and a first region, the first region disposed between the first and second portions of the first electrically conductive element, wherein the first electrically conductive element is disposed on the first thermally conductive and electrically insulative layer;
- a first thermoelectric element disposed on the tenth surface of the second portion of the first electrically conductive element; and
- a second electrically conductive element having a third portion with eleventh and twelfth surfaces and a fourth portion having thirteenth and fourteenth surfaces, and a second region, the second region disposed between the third and fourth portions of the second electrically conductive element, wherein the eleventh surface of the third portion of the second electrically conductive element is disposed on the first thermoelectric element, and wherein the second electrically conductive element is disposed on the second thermally conductive and electrically insulative layer of the second substrate.

26. The thermoelectric device as claimed in claim 25, wherein the first or second substrate is made of a metal.

27. The thermoelectric device as claimed in claim 26, wherein the metal of the first or second substrate comprises aluminum, copper, and/or tin.

28. The thermoelectric device as claimed in claim 25, wherein the first or second substrate is made of an alloy.

29. The thermoelectric device as claimed in claim 28, wherein the alloy of the first or second substrate comprises Steel, stainless steel, aluminum, copper, and/or bronze.

30. The thermoelectric device as claimed in claim 25, wherein the first or second substrate is made of a semiconductor material.

31. The thermoelectric device as claimed in claim 25, wherein the first or second substrate comprises silicon, carbon, and/or sapphire.

32. The thermoelectric device as claimed in claim 25, wherein the substrates are made of different materials.

33. The thermoelectric device as claimed in claim 32 wherein one of the first and second substrates is made of aluminum, and the other of the first and second substrates is made of stainless steel.

34. The thermoelectric device as claimed in claim 25, wherein the thermoelectric device includes a plurality of thermoelectric elements, including the first thermoelectric element, and wherein all of the thermoelectric elements within the thermoelectric device have a same conductivity type.

* * * * *

UNITED STATES PATENT AND TRADEMARK OFFICE
CERTIFICATE OF CORRECTION

PATENT NO. : 10,454,013 B2
APPLICATION NO. : 13/678708
DATED : October 22, 2019
INVENTOR(S) : Thomas E. Zirkle et al.

Page 1 of 1

It is certified that error appears in the above-identified patent and that said Letters Patent is hereby corrected as shown below:

In the Specification

Column 24, Line 20, please delete "dams", and insert --claims--

Column 26, Line 32, please delete "Iridium", and insert --Indium--

Signed and Sealed this
Seventh Day of December, 2021

Drew Hirshfeld
*Performing the Functions and Duties of the
Under Secretary of Commerce for Intellectual Property and
Director of the United States Patent and Trademark Office*